US012733520B2

(12) United States Patent
Kato et al.

(10) Patent No.: US 12,733,520 B2
(45) Date of Patent: Sep. 8, 2026

(54) CIRCUIT MODULE HAVING REINFORCING BONDING MATERIALS, AND A METHOD OF MANUFACTURING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Yoshitaka Kato, Nisshin (JP); Takeshi Endo, Nisshin (JP); Kazuhiro Tsuruta, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 714 days.

(21) Appl. No.: 18/145,949

(22) Filed: Dec. 23, 2022

(65) Prior Publication Data

US 2023/0326845 A1 Oct. 12, 2023

(30) Foreign Application Priority Data

Apr. 11, 2022 (JP) ................................ 2022-065227

(51) Int. Cl.
*H10W 70/65* (2026.01)
*H05K 1/11* (2006.01)
(Continued)

(52) U.S. Cl.
CPC ............ *H10W 70/65* (2026.01); *H05K 1/111* (2013.01); *H10W 20/44* (2026.01);
(Continued)

(58) Field of Classification Search
CPC ............... H01L 23/49838; H01L 23/29; H01L 23/53204; H01L 23/3107; H01L 21/563;
(Continued)

(56) References Cited

U.S. PATENT DOCUMENTS 6,194,782 B1 * 2/2001 Katchmar ............ H10W 70/65 257/734
6,388,321 B1 * 5/2002 Hirai .................... H10W 72/30 257/737
(Continued)

FOREIGN PATENT DOCUMENTS

JP H05-315475 A 11/1993
JP H11-111768 A 4/1999
(Continued)

*Primary Examiner* — Wael M Fahmy
*Assistant Examiner* — Tiberiu Dan Onuta
(74) *Attorney, Agent, or Firm* — Posz Law Group, PLC

(57) ABSTRACT

A circuit module includes: a first circuit component having electrode pads on a first surface; and a second circuit component having electrode pads on a second surface. A conductive bonding material joins the electrode pads of the first circuit component to the electrode pads of the second circuit component respectively. A first reinforcing bonding material is not in contact with the conductive bonding material and joins the first surface of the first circuit component to the second surface of the second circuit component. A second reinforcing bonding material is located in contact with the first reinforcing bonding material, and joins the first surface of the first circuit component to the second surface of the second circuit component.

19 Claims, 20 Drawing Sheets

(51) Int. Cl.

| | |
|---|---|
| ***H10W 20/44*** | (2026.01) |
| ***H10W 74/01*** | (2026.01) |
| ***H10W 74/15*** | (2026.01) |
| ***H10W 74/40*** | (2026.01) |

(52) U.S. Cl.
CPC ......... *H10W 74/012* (2026.01); *H10W 74/15* (2026.01); *H10W 74/40* (2026.01)

(58) Field of Classification Search
CPC . H01L 2224/17151; H01L 2224/17154; H01L 2224/73204; H01L 2224/81194; H01L 2224/8192; H01L 2224/81191; H01L 2224/81203; H01L 24/17; H01L 24/81; H05K 1/111; H05K 3/3436; H05K 2201/10166; H05K 2201/10977
See application file for complete search history.

(56) References Cited

U.S. PATENT DOCUMENTS

| | | | | |
|---|---|---|---|---|
| 11,355,361 | B1 * | 6/2022 | Liang .................. | H10W 74/012 |
| 2002/0020923 | A1 | 2/2002 | Kanatake | |
| 2002/0162679 | A1 * | 11/2002 | Hannan .................. | H05K 3/305 257/E21.503 |
| 2003/0067313 | A1 | 4/2003 | Toyoshima et al. | |
| 2008/0153202 | A1 | 6/2008 | Uemura et al. | |
| 2009/0321919 | A1 * | 12/2009 | Sugino ................ | H10W 74/012 257/E23.116 |
| 2010/0052189 | A1 * | 3/2010 | Sakurai .................. | H05K 3/321 257/E21.511 |
| 2014/0015452 | A1 * | 1/2014 | Nagase ............. | H05K 7/14329 363/131 |
| 2021/0183823 | A1 | 6/2021 | Emori et al. | |

FOREIGN PATENT DOCUMENTS

| | | | | | |
|---|---|---|---|---|---|
| JP | 2000-012615 | | | 1/2000 | |
| JP | 2002-368155 | A | | 12/2002 | |
| JP | 2005142210 | | * | 6/2005 | ............. H01L 21/60 |
| JP | 2005142210 | A | * | 6/2005 | ............. H01L 21/60 |
| JP | 2014-130961 | A | | 7/2014 | |
| JP | 2014-179496 | A | | 9/2014 | |
| JP | 2016-219530 | A | | 12/2016 | |
| JP | 2017-143310 | A | | 8/2017 | |

* cited by examiner 41
(24b)
14b
41
42
21
12(22)
y
x
14a
(24a)
41
14c
(24c)
11

CIRCUIT MODULE HAVING REINFORCING BONDING MATERIALS, AND A METHOD OF MANUFACTURING THE SAME

CROSS REFERENCE TO RELATED APPLICATION

This application is based on Japanese Patent Application No. 2022-065227 filed on Apr. 11, 2022, the disclosure of which is incorporated herein by reference.

TECHNICAL FIELD

The present disclosure relates to a circuit module and a manufacturing method thereof.

BACKGROUND

A circuit module is formed by bonding a chip component to a circuit board. In this technology, an electrode pad provided on the chip component is joined to an electrode pad provided on the circuit board via a conductive joining material such as solder.

SUMMARY

According to an aspect of the present disclosure, a circuit module includes: a first circuit component having a first surface on which a plurality of electrode pads is arranged; a second circuit component having a second surface on which a plurality of electrode pads is arranged; a conductive bonding material; a first reinforcing bonding material; and a second reinforcing bonding material made of a material different from the conductive bonding material and the first reinforcing bonding material. The first circuit component and the second circuit component are arranged such that the plurality of electrode pads of the first circuit component respectively face the plurality of electrode pads of the second circuit component. The conductive bonding material joins the plurality of electrode pads of the first circuit component to the plurality of electrode pads of the second circuit component respectively. The first reinforcing bonding material is not in contact with the conductive bonding material and joins the first surface of the first circuit component to the second surface of the second circuit component. The second reinforcing bonding material covers a periphery of the conductive bonding material and is located in a range in contact with the first reinforcing bonding material. The second reinforcing bonding material joins the first surface of the first circuit component to the second surface of the second circuit component.

BRIEF DESCRIPTION OF DRAWINGS

FIG. 23A is a plan view showing a manufacturing step of the circuit module of the tenth embodiment;

FIG. 23B is a cross-sectional view of FIG. 23A;

DETAILED DESCRIPTION

Figure 1:
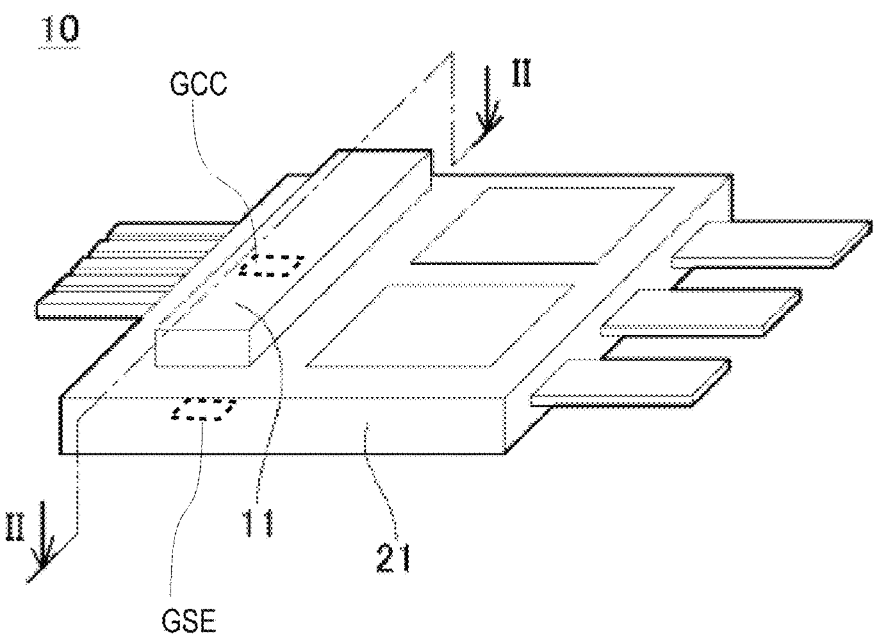
FIG. 1 is a perspective view of a circuit module according to a first embodiment.

To begin with, examples of relevant techniques will be described. A circuit module is formed by bonding a chip component to a circuit board. In this technology, an electrode pad provided on the chip component is joined to an electrode pad provided on the circuit board via a conductive joining material (specifically, solder). After that, an underfill resin is applied as a reinforcing material around the conductive joining material to protect the conductive joining material. The circuit module is heated when the conductive joining material is adhered to the electrode pad. A high thermal stress is applied to the conductive joining material in the process of lowering the temperature of the circuit module after the conductive joining material is fixed to the electrode pad. Since the underfill resin is not provided at the stage of fixing the conductive joining material to the electrode pad, the conductive joining material may be damaged by thermal stress.

A pre-applied sealing material can be used as a reinforcing material in a circuit module. The pre-applied sealing material is applied around a conductive bonding material when the conductive bonding material is arranged between a semiconductor chip and a circuit board. After that, the circuit module is heated to bond the conductive bonding material to the electrode pad. At this time, the sealing material is also cured. Thereafter, thermal stress is applied to the conductive bonding material when the temperature of the circuit module drops. However, since the semiconductor chip and the circuit board are connected not only by the conductive bonding material but also by the sealing material, the thermal stress applied to the conductive bonding material is reduced. This suppresses breakage of the conductive bonding material.

Outgas is generated from the conductive bonding material when the conductive bonding material is heated. For example, when the conductive bonding material is a conductive paste (such as a mixture of a conductive material and a resin), heating causes the solvent to evaporate from the conductive paste, as the outgas. When the conductive bonding material is solder, the flux evaporates due to heating as the outgas. When the conductive bonding material is heated while being covered with the sealing material, voids are formed inside the sealing material due to outgassing generated from the conductive bonding material. In this case, the reliability of the circuit module is lowered. This specification proposes a circuit module that can suppress breakage of a conductive bonding material by a reinforcing material and suppress generation of voids inside the reinforcing material.

A circuit module includes: a first circuit component having a first surface on which a plurality of electrode pads is arranged; a second circuit component having a second surface on which a plurality of electrode pads is arranged; a conductive bonding material; a first reinforcing bonding material; and a second reinforcing bonding material made of a material different from the conductive bonding material and the first reinforcing bonding material. The first circuit component and the second circuit component are arranged such that the plurality of electrode pads of the first circuit component respectively face the plurality of electrode pads of the second circuit component. The conductive bonding material joins the plurality of electrode pads of the first circuit component to the plurality of electrode pads of the second circuit component respectively. The first reinforcing bonding material is not in contact with the conductive bonding material and joins the first surface of the first circuit component to the second surface of the second circuit component. The second reinforcing bonding material covers a periphery of the conductive bonding material and is located in a range in contact with the first reinforcing bonding material. The second reinforcing bonding material joins the first surface of the first circuit component to the second surface of the second circuit component.

When manufacturing the circuit module, the conductive bonding material is in contact with each electrode pad of the first circuit component and each electrode pad of the second circuit component. The conductive bonding material and the first reinforcing bonding material are placed in contact with the first surface of the first circuit component and the second surface of the second circuit component, at a position where the first reinforcing bonding material is not in contact with the conductive bonding material. The laminate of the first circuit component and the second circuit component can be heated in this state. Due to the heating, the conductive bonding material adheres to each electrode pad of the first circuit component and each electrode pad of the second circuit component. Also, the first reinforcing bonding material adheres to the first surface of the first circuit component and the second surface of the second circuit component. While outgas is generated from the conductive bonding material during the heating, since the first reinforcing bonding material is not in contact with the conductive bonding material, generation of voids in the first reinforcing bonding material is suppressed. After that, when the temperature of the laminate is lowered, thermal stress is applied to the conductive bonding material. However, since the first reinforcing bonding material joins the first circuit component and the second circuit component, thermal stress applied to the conductive bonding material is reduced. This suppresses breakage of the conductive bonding material. The second reinforcing bonding material is formed so as to cover the conductive bonding material, thereby protecting the conductive bonding material and ensuring the reliability of the circuit module. Since the second reinforcing bonding material is formed after the conductive bonding material is fixed to each electrode pad, it is not affected by outgassing generated from the conductive bonding material. Therefore, the formation of voids in the second reinforcing bonding material is suppressed. As described above, in this circuit module, it is possible to suppress damage to the conductive bonding material when the temperature drops after heating, and to suppress the generation of voids inside the first reinforcing bonding material and the second reinforcing bonding material.

In one example of the circuit module disclosed in this specification, the conductive bonding material may be made of a mixture of a conductive material and a resin.

In this configuration, since outgassing is likely to occur from the conductive bonding material, the generation of voids is more effectively suppressed.

In one example of the circuit module disclosed in this specification, the plurality of electrode pads of the first circuit component forms a row linearly arranged along a first direction on the first surface of the first circuit component. The plurality of electrode pads of the second circuit component may be linearly arranged along the first direction at a position facing the row. The first reinforcing bonding material may be arranged at a position shifted from the row in a second direction crossing the first direction. The first reinforcing bonding material may be continuously distributed in the first direction from a position of one end of the row to a position of the other end of the row.

Accordingly, the thermal stress applied to the conductive bonding material can be effectively reduced in the area in contact with the electrode pads at the one end and the other end.

In one example of the circuit module disclosed in this specification, the plurality of electrode pads of the first circuit component are arranged on the first surface of the first circuit component to form a first row along a first direction and a second row arranged linearly along the first direction at a position shifted from the first row in a second direction intersecting the first direction. The plurality of electrode pads of the second circuit component are arranged to form a third row linearly along the first direction at a position facing the first row, and a fourth row arranged linearly along the first direction at a position facing the second row. The first reinforcing bonding material may be arranged between the first row and the second row in the second direction.

Accordingly, the thermal stress applied to the conductive bonding material can be effectively reduced in the area in contact with each electrode pad.

In one example of the circuit module disclosed in this specification, one of the first circuit component and the second circuit component may have a gate-type switching element. The other of the first circuit component and the second circuit component may have a gate control circuit that controls the gate voltage of the switching element.

In one example of the circuit module disclosed in this specification, the coefficient of linear expansion of the second reinforcing bonding material may be higher than the coefficient of linear expansion of the conductive bonding material.

Accordingly, it is possible to effectively reduce the residual stress generated in the conductive bonding material after the formation of the second reinforcing bonding material.

In one example of the circuit module disclosed in this specification, the coefficient of linear expansion of the first reinforcing bonding material may be lower than the coefficient of linear expansion of the conductive bonding material.

Accordingly, it is possible to effectively reduce the residual stress generated at the end of the second reinforcing bonding material after the formation of the second reinforcing bonding material.

In one example of the circuit module disclosed in this specification, the coefficient of linear expansion of the first reinforcing bonding material may be higher than half the coefficient of linear expansion of the second reinforcing bonding material.

Accordingly, it is possible to effectively reduce the residual stress generated at the interface between the first reinforcing bonding material and the second reinforcing bonding material after the second reinforcing bonding material is formed.

In one example of the circuit module disclosed in this specification, the first reinforcing bonding material may be arranged to form a plurality of islands separated from each other. The second reinforcing bonding material may surround each island.

In one example of the circuit module disclosed in this specification, at least one of the first surface of the first circuit component and the second surface of the second circuit component may have a recess. The first reinforcing bonding material may be arranged within the recess.

Accordingly, it is possible to suppress variations in the bonding range of the first reinforcing bonding material.

In one example of the circuit module disclosed in this specification, at least one of the first surface of the first circuit component and the second surface of the second circuit component may have a groove extending annularly. The first reinforcing bonding material may be arranged within a range surrounded by the groove. An outer peripheral edge of the first reinforcing bonding material may be arranged within the groove.

Accordingly, it is possible to suppress variations in the bonding range of the first reinforcing bonding material.

In one example of the circuit module disclosed in this specification, at least one of the first surface of the first circuit component and the second surface of the second circuit component has a less-rough surface and a rough surface having a roughness greater than that of the less-rough surface. The first reinforcing bonding material may be in contact with the less-rough surface.

Accordingly, it is possible to suppress variations in the bonding range of the first reinforcing bonding material.

In one example of the circuit module disclosed in this specification, the first reinforcing bonding material may be made of the same material as the conductive bonding material.

Accordingly, the conductive bonding material and the first reinforcing bonding material can be applied at once.

In one example of the circuit module disclosed in this specification, a ratio of an area of a bonding range by the conductive bonding material to an area of a facing portion where the first circuit component and the second circuit component face each other may be 15% or less.

The present specification also proposes a method of manufacturing the circuit module. The manufacturing method has first to fourth steps. The first step is to dispose the conductive bonding material and the first reinforcing bonding material between the first circuit component and the second circuit component. In the first step, the electrode pads provided on the first surface of the first circuit component face the electrode pads provided on the second surface of the second circuit component, the conductive bonding material is in contact with the electrode pads of the first circuit component and the electrode pads of the second circuit component, and the first reinforcing bonding material is in contact with the first surface of the first circuit component and the second surface of the second circuit component at a position not in contact with the conductive bonding material. In the second step, the laminate of the first circuit component and the second circuit component is heated such that the conductive bonding material is fixed to the electrode pads of the first circuit component and the electrode pads of the second circuit component and that the first reinforcing bonding material is fixed to the first surface of the first circuit component and the second surface of the second circuit component. In the third step, the second reinforcing bonding material made of a material different from the conductive bonding material and the first reinforcing bonding material is applied between the first surface of the first circuit component and the second surface of the second circuit component. In the third step, the second reinforcing bonding material is applied such that the second reinforcing bonding material covers the periphery of the conductive bonding material, that the second reinforcing bonding material is distributed in a range in contact with the first reinforcing bonding material, and that the second reinforcing bonding material is in contact with the first surface of the first circuit component and the second surface of the second circuit component. In the fourth step, the laminate is heated such that second reinforcing bonding material is fixed to the first surface of the first circuit component and the second surface of the second circuit component.

According to this manufacturing method, it is possible to suppress the breakage of the conductive bonding material due to the reinforcing material, and suppress the generation of voids inside the reinforcing material.

In one example of the manufacturing method disclosed in this specification, the first reinforcing bonding material may be made of the same material as the conductive bonding material. The step of disposing the conductive bonding material and the first reinforcing bonding material between the first circuit component and the second circuit component may include: applying the conductive bonding material and the first reinforcing bonding material to one of the first surface of the first circuit component and the second surface of the second circuit component at once.

According to this configuration, the conductive bonding material and the first reinforcing bonding material can be applied at once.

In one example of the manufacturing method disclosed in this specification, the first circuit component has a through hole open to the first surface of the first circuit component, or the second circuit component may have a through hole open to the second surface of the second circuit component. When applying the second reinforcing bonding material, the second reinforcing bonding material is injected between the first surface of the first circuit component and the second surface of the second circuit component through the through hole.

Accordingly, the second reinforcing bonding material can be suitably injected between the first surface of the first circuit component and the second surface of the second circuit component.

As shown in FIG. 1, a circuit module 10 according to an embodiment has a circuit component 11 and a circuit component 21. The circuit component 11 is joined to the circuit component 21. The circuit component 21 includes a gate-type switching element GSE that is a power semiconductor. The circuit component 11 includes a gate control circuit GSE that controls the gate voltage of the switching element of the circuit component 21.

Figure 2:
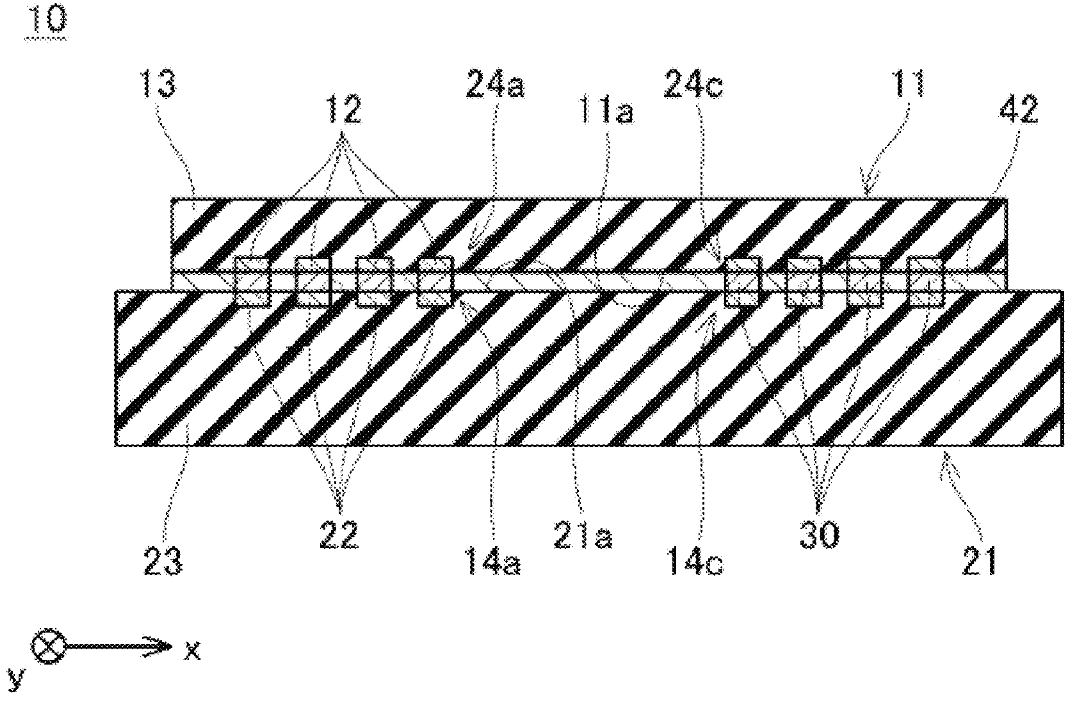
FIG. 2 is a cross-sectional view of the circuit module take along line II-II in FIG. 1 corresponding to a straight line 16*a* in FIG. 3.

As shown in FIG. 2, electrode pads 12 are provided on the surface 11*a* of the circuit component 11. A part of the surface 11*a* other than the electrode pads 12 is made of an insulating resin 13. Although not shown, a semiconductor chip, wiring, and the like of the gate control circuit are provided inside the insulating resin 13.

Electrode pads 22 are provided on the surface 21*a* of the circuit component 21. A part of the surface 21*a* other than the electrode pads 22 is made of an insulating resin 23. Although not shown, a semiconductor chip, wiring, and the like, of the switching element are provided inside the insulating resin 23.

The circuit component 11 is stacked on the circuit component 21 such that the surface 21*a* of the circuit component 21 faces the surface 11*a* of the circuit component 11. The electrode pads 12 of the circuit component 11 respectively faces the electrode pads 22 of the circuit component 21 in a one-to-one relationship. That is, each electrode pad 12 faces a corresponding one of the electrode pads 22.

Figure 3:
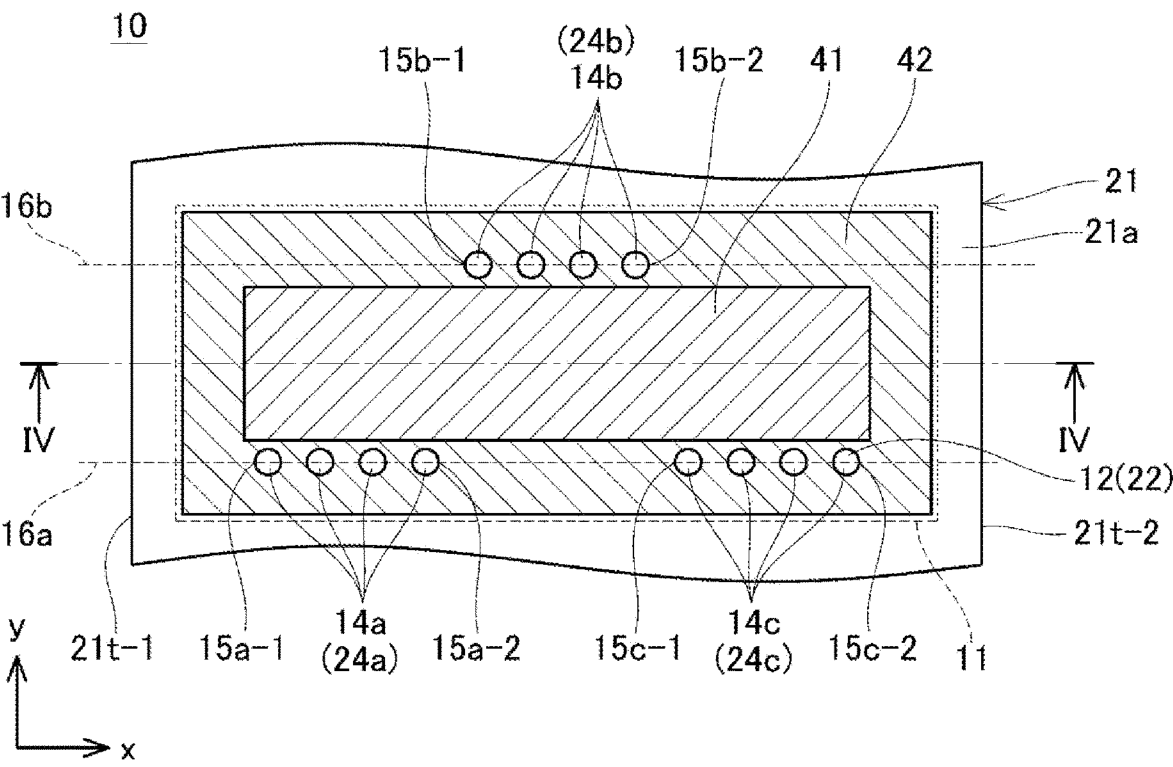
FIG. 3 is a top plan view of the circuit module.

FIG. 3 shows a plan view of the circuit component 11 and the circuit component 21 viewed from the upper side in the stacking direction. Since each electrode pad 12 faces each electrode pad 22 in a one-to-one relationship, FIG. 3 shows the electrode pads 12 and 22 in an overlapping state. In FIG. 3, the outer shape of the circuit component 11 is indicated by a broken line. As shown in FIG. 3, the electrode pads 12 are arranged on the surface 11*a* of the circuit component 11 so as to form three rows 14*a* to 14*c*. In each of the rows 14*a* to 14*c*, the electrode pads 12 are linearly arranged at regular interval along the x direction. The row 14*c* is arranged on the same straight line as a straight line 16*a* from which the row 14*a* extends. The row 14*c* is spaced in the x direction from the row 14*a*. The row 14*b* is arranged at a position offset from the rows 14*a* and 14*c* in the y direction (that is, the direction perpendicular to the x direction). That is, a straight line 16*b* along which the row 14*b* extends is arranged at a position offset in the y direction from the straight line 16*a* along which the rows 14*a* and 14*c* extend. The row 14*b* is arranged between the rows 14*a* and 14*c* in the x direction. As described above, the electrode pads 22 of the circuit component 21 are arranged so as to overlap the electrode pads 12 of the circuit component 11. Accordingly, the electrode pads 22 are arranged on the surface 21*a* of the circuit component 21 so as to form the rows 24*a* to 24*c* extending along the rows 14*a* to 14*c* respectively. That is, in each of the rows 24*a* to 24*c*, the electrode pads 22 are linearly arranged at equal interval along the x direction. The rows 24*a* and 24*c* are arranged on the same straight line as the straight line 16*a* at positions facing the rows 14*a* and 14*c* respectively. The row 24*b* is arranged on the same straight line as the straight line 16*b* at a position facing the row 14*b*.

As shown in FIG. 2, a conductive bonding material 30 is arranged between the circuit component 11 and the circuit component 21. The conductive bonding material 30 is made of a mixture of a conductive material and a resin. However, the conductive bonding material 30 may be made of solder. The conductive bonding material 30 is disposed between the electrode pad 12 and the electrode pad 22 facing each other. The conductive bonding material 30 is fixed to the upper electrode pad 12 and the lower electrode pad 22. The conductive bonding material 30 bonds and electrically connects the electrode pad 12 to the electrode pad 22. A ratio of the bonding area by the conductive bonding material 30 to an area where the circuit component 11 and the circuit component 21 face each other is 15% or less.

Figure 4:
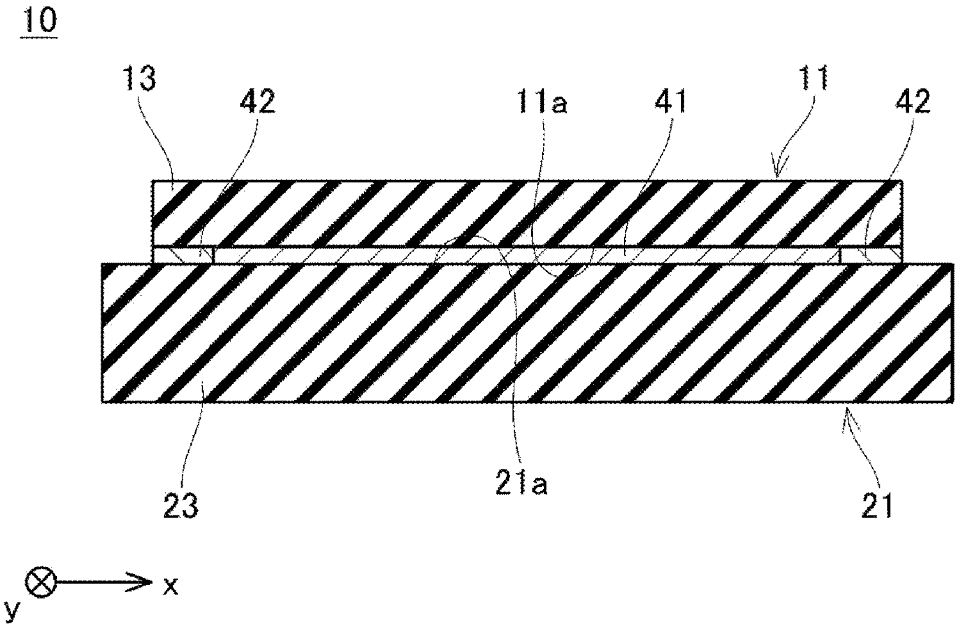
FIG. 4 is a cross-sectional view taken along line IV-IV of FIG. 3.

As shown in FIGS. 2 to 4, reinforcing bonding materials 41 and 42 are arranged between the circuit component 11 and the circuit component 21. The reinforcing bonding materials 41 and 42 are insulating bonding materials. The reinforcing bonding material 42 is made of a material different from that of the reinforcing bonding material 41.

As shown in FIG. 3, the reinforcing bonding material 41 is arranged between the straight line 16*a* (along which the rows 14*a* and 14*c* extend) and the straight line 16*b* (along which the row 14*b* extends). The reinforcing bonding material 41 is not in contact with the conductive bonding material 30, the electrode pads 12 and the electrode pads 22. As shown in FIG. 4, the reinforcing bonding material 41 joins the surface 11*a* of the circuit component 11 and the surface 21*a* of the circuit component 21. More specifically, the reinforcing bonding material 41 bonds the surface of the insulating resin 13 on the surface 11*a* and the surface of the insulating resin 23 on the surface 21*a*.

As shown in FIG. 3, the reinforcing bonding material 42 is arranged around the reinforcing bonding material 41. The reinforcing bonding material 42 is in contact with the entire outer peripheral surface of the reinforcing bonding material 41. The electrode pads 12, 22 (the rows 14*a*-14*c*, 24*a*-24*c*) are included within the distribution range of the reinforcing bonding material 42. As shown in FIG. 2, the reinforcing bonding material 42 surrounds the conductive bonding material 30. In other words, the reinforcing bonding material 42 surrounds each connecting portion where the electrode pad 12 and the electrode pad 22 are connected by the conductive bonding material 30. The reinforcing bonding material 42 is in contact with the entire outer peripheral surface of each connecting portion of the conductive bonding material 30. As shown in FIGS. 2 and 4, the reinforcing bonding material 42 joins the surface 11*a* of the circuit component 11 and the surface 21*a* of the circuit component 21. More specifically, the reinforcing bonding material 42 bonds the surface of the insulating resin 13 on the surface 11*a* and the surface of the insulating resin 23 on the surface 21*a*.

As shown in FIG. 3, the circuit component 21 has an end 21*t*-1 and an end 21*t*-2 in the x direction. The row 14*a* has an end 15*a*-1 near the end 21*t*-1 and an end 15*a*-2 near the end 21*t*-2 in the x-direction. The row 14*b* has an end 15*b*-1 near the end 21*t*-1 and an end 15*b*-2 near the end 21*t*-2 in the x-direction. The row 14*c* has an end 15*c*-1 near the end 21*t*-1 and an end 15*c*-2 near the end 21*t*-2 in the x-direction. The reinforcing bonding material 41 extends from a position outside the end 15*a*-1 (the position between the end 21*t*-1 and the end 15*a*-1) to a position outside the end 15*c*-2 (the position between the end 21*t*-2 and the end 15*c*-2) in the x direction. Therefore, in the vicinity of the row 14*a*, the reinforcing bonding material 41 extends from a position outside the end 15*a*-1 to a position outside the end 15*a*-2. In the vicinity of the row 14*b*, the reinforcing bonding material 41 extends from a position outside the end 15*b*-1 to a position outside the end 15*b*-2. In the vicinity of the row 14*c*, the reinforcing bonding material 41 extends from a position outside the end 15*c*-1 to a position outside the end 15*c*-2.

A linear expansion coefficient K30 of the conductive bonding material 30, a linear expansion coefficient K41 of the reinforcing bonding material 41, and a linear expansion coefficient K42 of the reinforcing bonding material 42 satisfy the relationship of K42/2<K41<K30<K42.

Next, a method for manufacturing the circuit module 10 will be described. The circuit module 10 is manufactured by bonding the circuit component 11 and the circuit component 21 together.

(Process of Applying the Conductive Bonding Material 30 and the Reinforcing Bonding Material 41)

First, the conductive bonding material 30 and the reinforcing bonding material 41 are applied to the surface 21*a* of the circuit component 21. Specifically, the conductive bonding material 30 is applied to the surface of each electrode pad 22. The conductive bonding material 30 may be a conductive paste (that is, a paste in which a conductive material, a resin, and a solvent are mixed, such as silver paste) or cream solder. The conductive bonding material 30 may be a preformed solder (such as solder ball). In this case, the conductive bonding material 30 (that is, preformed solder) is placed on each electrode pad 22 instead of coating. Further, the reinforcing bonding material 41 is applied to the surface 21*a* in the range between the straight lines 16*a* and 16*b* so as not to contact the electrode pads 22 and the conductive bonding material 30. Instead of applying the conductive bonding material 30 and the reinforcing bonding material 41 to the surface 21*a* of the circuit component 21, the conductive bonding material 30 and the reinforcing bonding material 41 may be applied to the surface 11*a* of the circuit component 11.

(Lamination Process)

As shown in FIG. 2, the circuit component 11 is laminated on the circuit component 21 such that the surface 11*a* faces the surface 21*a* (that is, each electrode pad 12 faces the corresponding electrode pad 22). Thereby, the conductive bonding material 30 and the reinforcing bonding material 41 are arranged between the circuit component 11 and the circuit component 21. The conductive bonding material 30 contacts both the electrode pads 12, 22, and the reinforcing bonding material 41 contacts both the surfaces 11*a*, 21*a*. The conductive bonding material 30 and the reinforcing bonding material 41 spread laterally when the circuit component 11 is pressed onto the circuit component 21, but even in this state, the reinforcing bonding material 41 remains not in contact with the conductive bonding material 30 and the electrode pads 12, 22.

(First Heating Process)

Next, the laminate of the circuit components 11 and 21 is heated. As a result, the conductive bonding material 30 is adhered to the electrode pads 12 and 22, and the reinforcing bonding material 41 is adhered to the surfaces 11*a* and 21*a*. The reinforcing bonding material 41 is hardened by heating and adheres to the surfaces 11*a* and 21*a*. When the conductive bonding material 30 is a conductive paste, the conductive bonding material 30 hardens by heating and adheres to the electrode pads 12 and 22. When the conductive bonding material 30 is solder, the conductive bonding material 30 is melted by heating. After that, when the temperature of the laminate drops, the conductive bonding material 30 solidifies and adheres to the electrode pads 12 and 22. Note that outgas is generated from the conductive bonding material 30 when the conductive bonding material 30 is heated. That is, when the conductive bonding material 30 is a conductive paste, the solvent contained in the conductive paste is volatilized by heating to generate outgas. When the conductive bonding material 30 is solder, the flux contained in the solder is volatilized by heating to generate outgas. Since the outer peripheral surface of the conductive bonding material 30 is exposed at each connecting portion, the outgas generated in the conductive bonding material 30 is discharged to the outside of the laminate. Since the conductive bonding material 30 is not in contact with the reinforcing bonding material 41, formation of voids inside the reinforcing bonding material 41 due to outgassing generated in the conductive bonding material 30 is prevented.

(Temperature Lowering Process)

After the conductive bonding material 30 and the reinforcing bonding material 41 have adhered to their respective objects, the temperature of the laminate is lowered to room temperature. Each of the circuit components 11 and 21 shrinks in the process of lowering the temperature of the laminate. Since there is a difference in coefficient of linear expansion between the circuit component 11 and the circuit component 21, the amount of contraction differs between the circuit component 11 and the circuit component 21. Therefore, shear stress is applied to the conductive bonding material 30 at each connecting portion. Since the amount of contraction differs between the circuit component 11 and the circuit component 21, the circuit components 11 and 21 are warped. Therefore, tensile stress is applied to the conductive bonding material 30 at each connecting portion. In this embodiment, the circuit component 11 and the circuit component 21 are bonded together by the reinforcing bonding material 41 as well as the conductive bonding material 30 at the stage of the temperature lowering process. Since the deformation of the circuit component 11 and the circuit component 21 is suppressed by the reinforcing bonding material 41, the thermal stress applied to the conductive bonding material 30 in the temperature lowering process is reduced. This suppresses breakage of the conductive bonding material 30 in the temperature lowering process.

(Process of Filling the Reinforcing Bonding Material 42)

The gap between the surface 11*a* of the circuit component 11 and the surface 21*a* of the circuit component 21 (that is, the space around the reinforcing bonding material 41) is filled with the reinforcing bonding material 42. The reinforcing bonding material 42 is filled to cover the outer peripheral surface of the conductive bonding material 30 at each connecting portion, cover the outer peripheral surface of the reinforcing bonding material 41, and be in contact with the surfaces 11*a* and 21*a*.

(Second Heating Process)

Next, the laminate of the circuit components 11 and 21 is heated. As a result, the reinforcing bonding material 42 is cured and fixed to the surfaces 11*a* and 21*a*. Further, the reinforcing bonding material 42 is in close contact with the outer peripheral surface of the conductive bonding material 30 at each connecting portion to protect the conductive bonding material 30.

Thus, the circuit module 10 shown in FIGS. 1 to 4 is completed. As described above, in the first heating process, since the outer peripheral surface of the conductive bonding material 30 is exposed, formation of voids in the reinforcing bonding material 41 due to outgassing from the conductive bonding material 30 can be prevented. Further, since the reinforcing bonding material 42 is formed after the first heating process is performed, it is not affected by outgassing generated from the conductive bonding material 30. Therefore, formation of voids in the reinforcing bonding material 42 can be suppressed. Thus, according to this manufacturing method, formation of voids in the reinforcing bonding materials 41 and 42 can be suppressed. Further, in the first heating process, the thermal stress applied to the conductive bonding material 30 is reduced by the reinforcing bonding material 41, so that damage to the conductive bonding material 30 can be suppressed.

In this embodiment, the reinforcing bonding material 41 is arranged between the two straight lines 16*a* and 16*b* along which the rows of electrode pads 12 and 22 extend. Accordingly, the thermal stress applied to the conductive bonding material 30 can be reduced at both the connecting portion on the straight line 16*a* and the connecting portion on the straight line 16*b*.

Further, thermal stress generated in the manufacturing process remains inside the circuit module 10 after the circuit module 10 is completed. Experiments have shown that the residual stress of the conductive bonding material 30 increases when the coefficient of linear expansion K42 of the reinforcing bonding material 42 is smaller than the linear expansion coefficient K30 of the conductive bonding material 30. This is because the tensile stress in the conductive bonding material 30 increases, as the amount of shrinkage of the reinforcing bonding material 42 is smaller than the amount of shrinkage of the conductive bonding material 30 when the temperature of the circuit module 10 decreases after the reinforcing bonding material 42 hardens. That is, stress acting in the direction of separating the conductive bonding material 30 from the electrode pads 12 and 22 is generated. In this embodiment, since the coefficient of linear expansion K42 of the reinforcing bonding material 42 is larger than the coefficient of linear expansion K30 of the conductive bonding material 30, the residual stress generated in the conductive bonding material 30 can be reduced.

Moreover, experiments have shown that the residual stress generated in the outermost peripheral portion of the reinforcing bonding material 42 increases when the coefficient of linear expansion K41 of the reinforcing bonding material 41 is greater than the linear expansion coefficient K30 of the conductive bonding material 30. This is because a high shear stress occurs in the outermost peripheral portion, as the reinforcing bonding material 41 pulls the reinforcing bonding material 42, when the amount of shrinkage of the reinforcing bonding material 41 is large while the temperature of the circuit module 10 decreases after the reinforcing bonding material 42 hardens. In this embodiment, since the linear expansion coefficient K41 of the reinforcing bonding material 41 is smaller than the linear expansion coefficient K30 of the conductive bonding material 30, the residual stress generated in the outermost peripheral portion of the reinforcing bonding material 42 can be reduced.

Experiments revealed that a large difference between the coefficient of linear expansion K41 of the reinforcing bonding material 41 and the coefficient of linear expansion K42 of the reinforcing bonding material 42 causes a high residual stress at the interface between the reinforcing bonding material 41 and the reinforcing bonding material 42. In this embodiment, the linear expansion coefficient K41 of the reinforcing bonding material 41 is larger than half the linear expansion coefficient K42 of the reinforcing bonding material 42 (that is, the difference between the linear expansion coefficient K41 and the linear expansion coefficient K42 is small). Therefore, the residual stress generated at the interface between the reinforcing bonding material 41 and the reinforcing bonding material 42 can be reduced.

Figure 5:
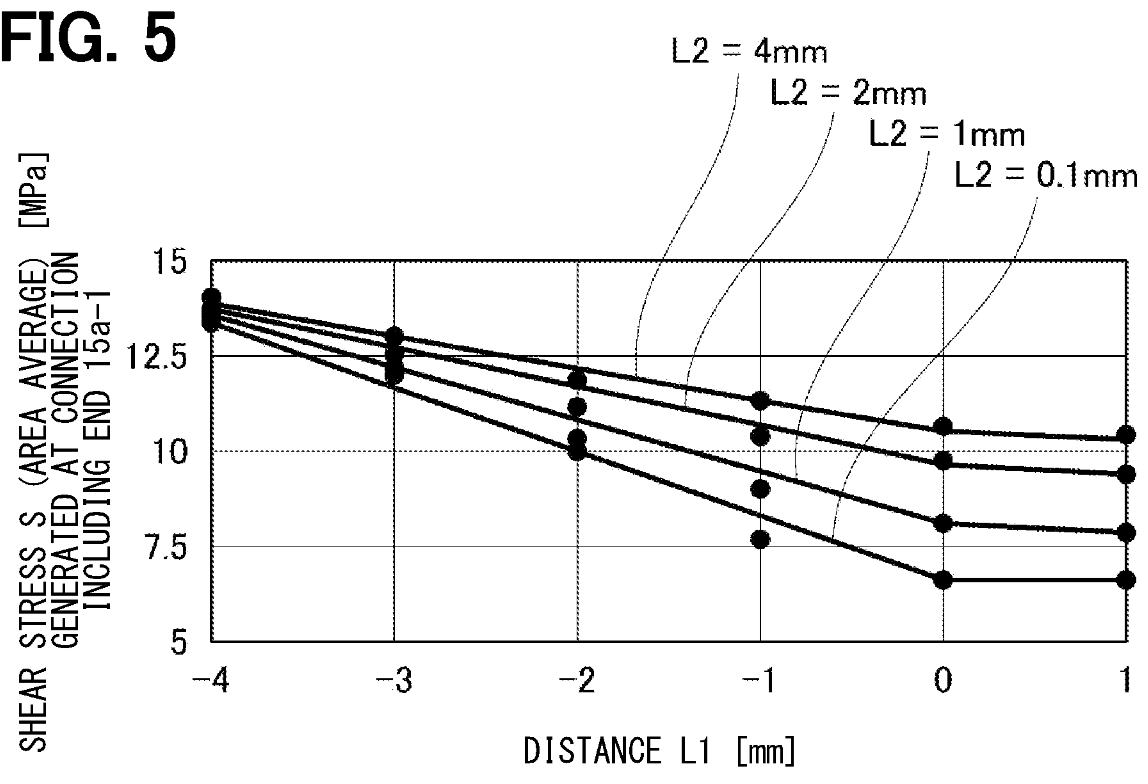
FIG. 5 is a graph showing a relationship between a distance L1 and a shear stress S.
Figure 6:
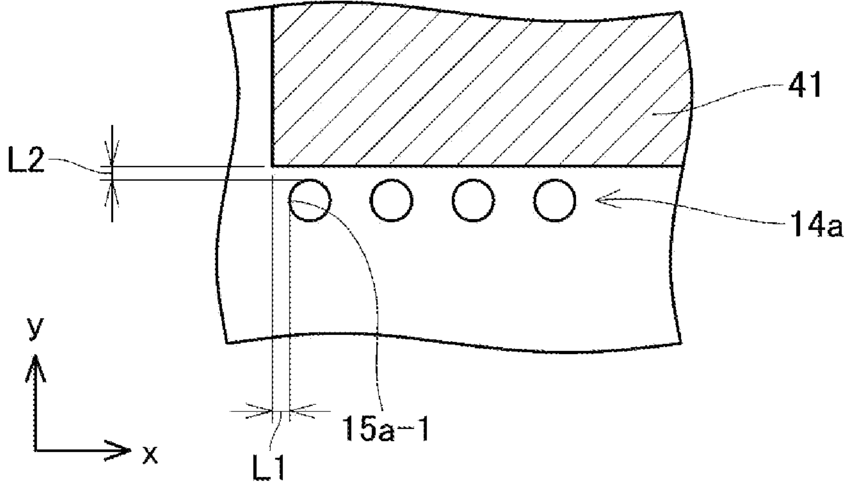
FIG. 6 is an explanatory diagram of a distance L1 and a distance L2.
Figure 7:
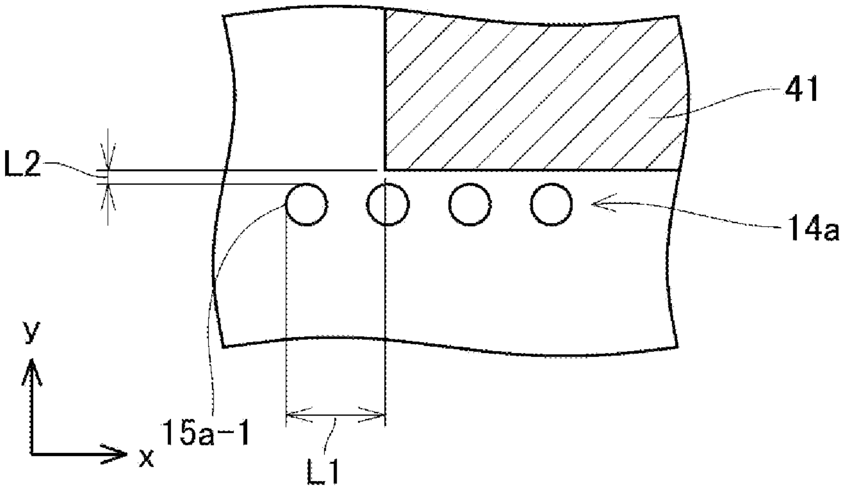
FIG. 7 is an explanatory diagram of a distance L1 and a distance L2.

FIG. 5 shows experimental results of measuring the shear stress S applied to the conductive bonding material 30 at the connection including the end 15*a*-1 in the temperature lowering process while changing the distribution range of the reinforcing bonding material 41 in the vicinity of the end 15*a*-1 of the row 14*a* as shown in FIGS. 6 and 7. A distance L1 shown on the horizontal axis in FIG. 5 represents a dimension L1 shown in FIG. 6 by which the reinforcing bonding material 41 protrudes from the end 15*a*-1 in the x direction. As shown in FIG. 7, when the reinforcing bonding material 41 does not extend up to the end 15*a*-1 in the x direction, the distance L1 is represented as a negative value. A distance L2 shown in FIG. 5 represents a dimension L2 between the reinforcing bonding material 41 and the row 14*a* as shown in FIGS. 6 and 7. When the reinforcing bonding material 41 was not provided, the shear stress S was 19.3 MPa. As shown in FIG. 5, the shear stress S can be reduced to a value lower than 19.3 MPa by providing the reinforcing bonding material 41 regardless of the values of the distances L1 and L2. Further, as shown in FIG. 5, regardless of the distance L2, when the distance L1 is a negative value, the shear stress S decreases as the distance L1 approaches zero. Further, regardless of the distance L2, when the distance L1 is greater than 0, the shear stress S becomes substantially the same value as when the distance L1 is 0. From this result, it can be seen that the shear stress S at the end 15*a*-1 can be effectively reduced by making the distance L1 larger than 0. In this embodiment, the reinforcing bonding material 41 continuously extends from the outside of one end of each row 14*a* to 14*c* to the outside of the other end. That is, the distance L1 of the reinforcing bonding material 41 is greater than 0 at each end of each row. Therefore, the thermal stress generated in the conductive bonding material 30 during the temperature lowering process can be efficiently reduced at each end of each row.

Figure 8:
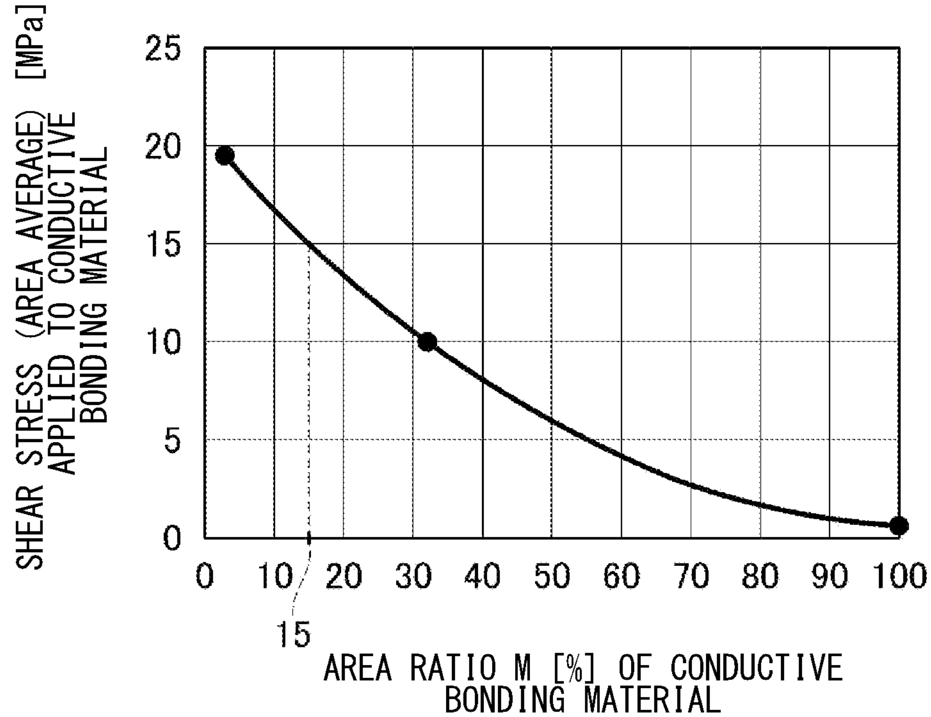
FIG. 8 is a graph showing a relationship between a shear stress applied to a conductive bonding material and an area ratio in case where a reinforcing bonding material is not present.
Figures 9, 10:
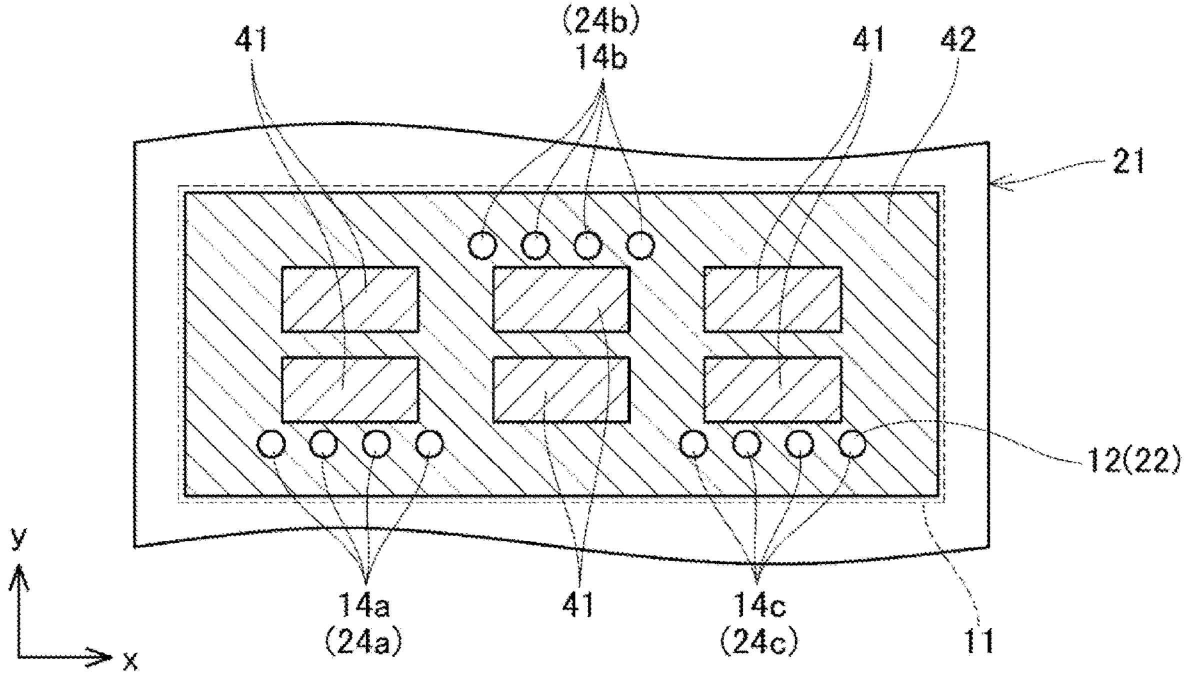
FIG. 9 is a plan view showing a circuit module according to a second embodiment.
FIG. 10 is a plan view showing a circuit module according to a third embodiment.

FIG. 8 shows experimental results of measuring the shear stress generated in the conductive bonding material in the temperature lowering process when the reinforcing bonding material is not used. The horizontal axis in FIG. 8 represents the area ratio M of the bonding range of the conductive bonding material to the area in which the two circuit components oppose to each other. As shown in FIG. 8, the smaller the area ratio M, the higher the shear stress generated in the conductive bonding material. The shear stress at which a common silver paste breaks is 15 MPa. As shown in FIG. 8, when the area ratio M is 15% or less, the shear stress generated in the conductive bonding material exceeds 15 MPa. By using the reinforcing bonding material 41, the shear stress generated in the conductive bonding material in the temperature lowering process can be made lower, compared with the case shown in FIG. 8. The breakage of the conductive bonding material can be suppressed when the area ratio M is 15% or less. That is, by applying the technique disclosed in this specification when the area ratio M is 15% or less, a higher effect of preventing breakage of the conductive bonding material can be obtained.

Figures 11, 12:
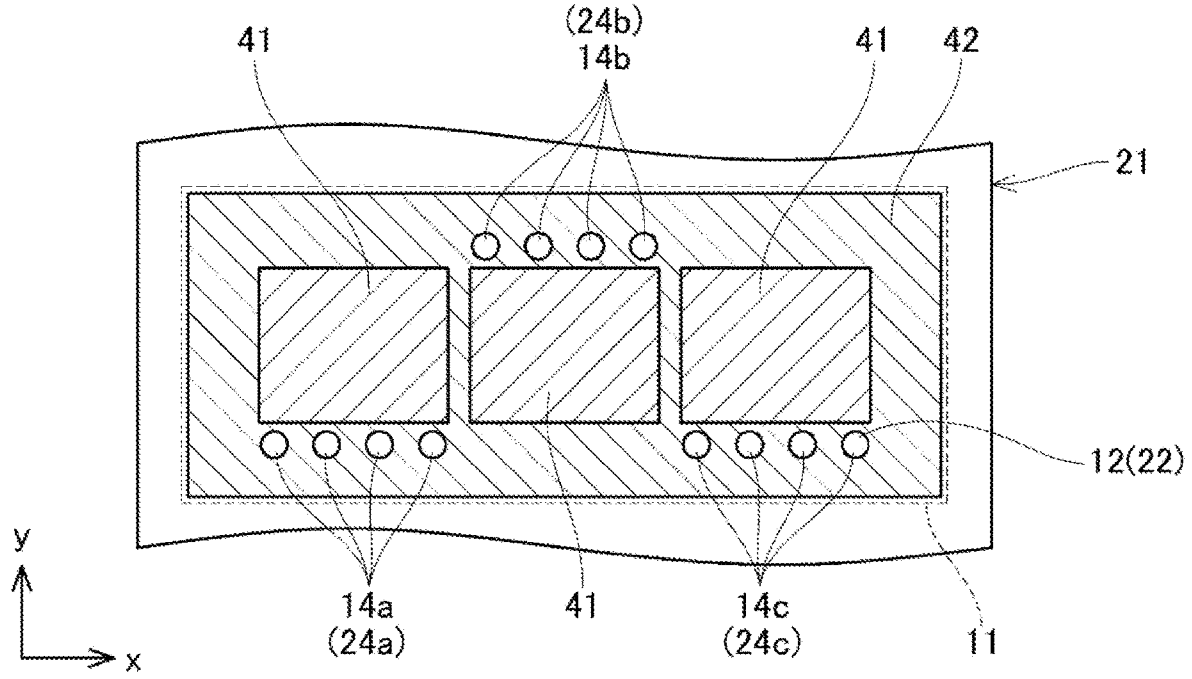
FIG. 11 is a plan view showing a circuit module according to a fourth embodiment.
FIG. 12 is a plan view showing a circuit module according to a fifth embodiment.
Figures 13, 14:
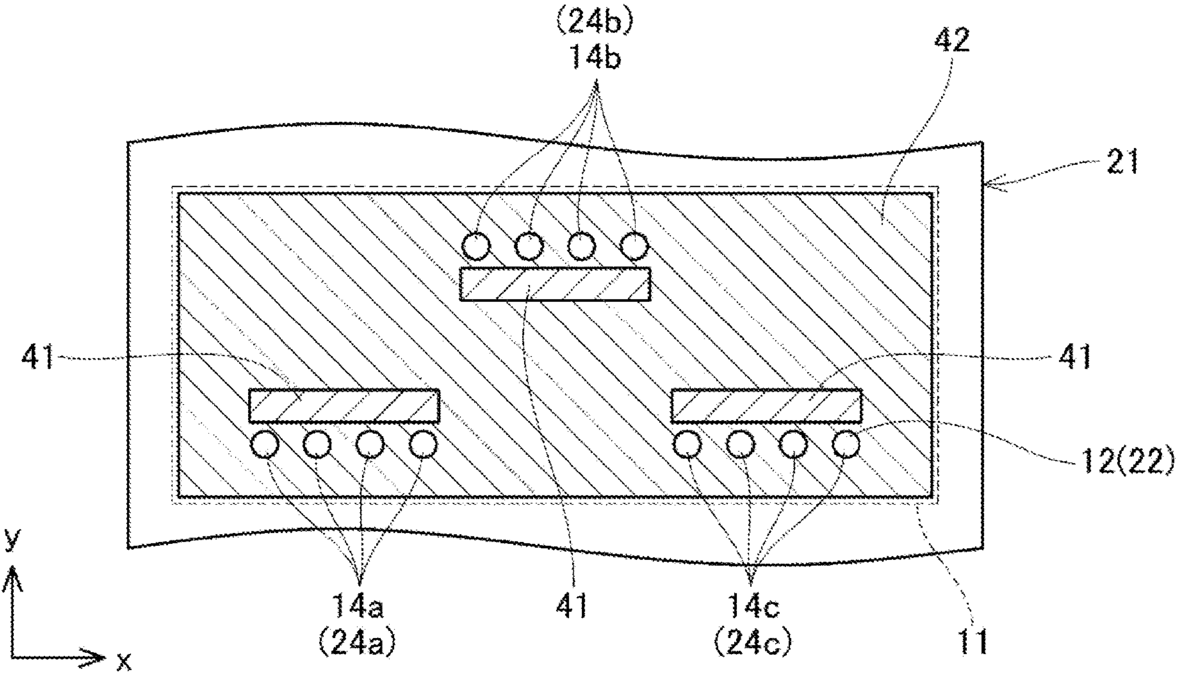
FIG. 13 is a plan view showing a circuit module according to a sixth embodiment.
FIG. 14 is a plan view showing a circuit module according to a seventh embodiment.

As shown in FIGS. 9 to 14, the reinforcing bonding material 41 may be formed to have plural islands isolated from each other. Accordingly, the outgas generated from the reinforcing bonding material 41 itself in the first heating process can be easily discharged to the outside of the laminate. Thereby, the generation of voids in the reinforcing bonding material 41 can be further suppressed. In this case, as shown in FIGS. 12 to 14, it is preferable that each island of the reinforcing bonding material 41 extends continuously from the outside of one end of each row to the outside of the other end at the position next to each row 14*a* to 14*c*. Accordingly, as described above with reference to FIG. 5, the shear stress S generated in the conductive bonding material 30 at each end can be reduced.

Figure 15A:
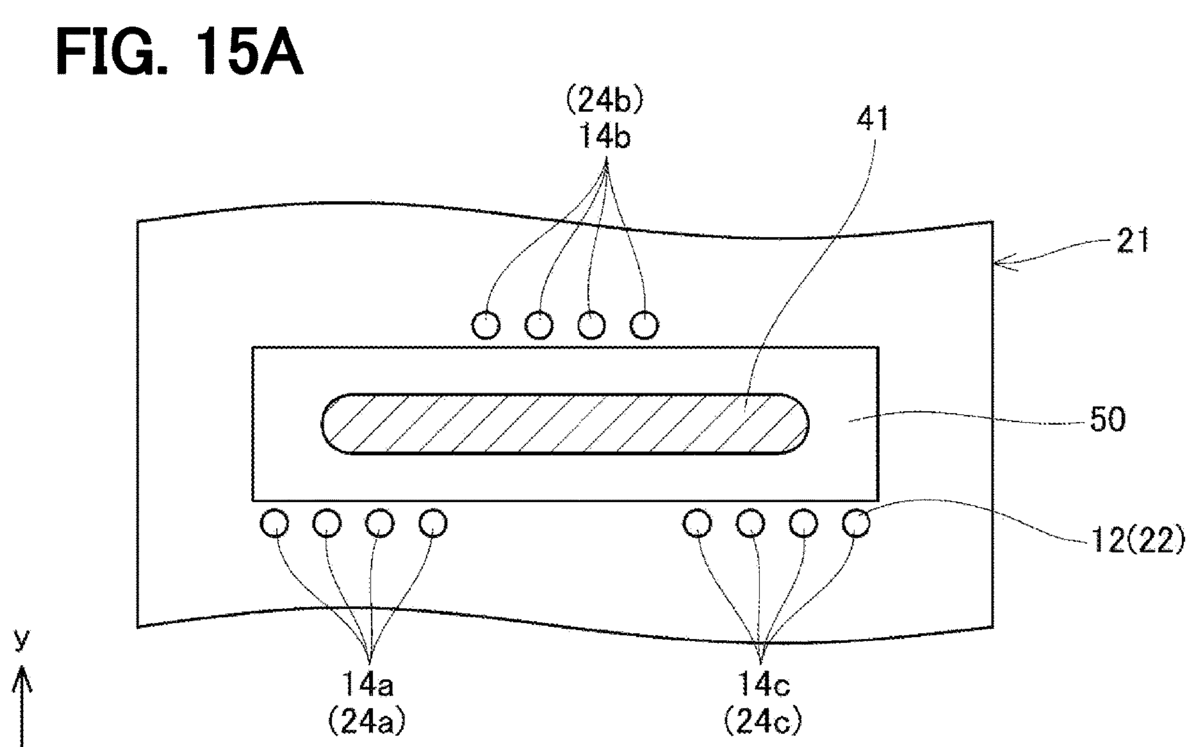
FIG. 15A is a plan view showing a manufacturing step of a circuit module according to an eighth embodiment.
Figure 15B:
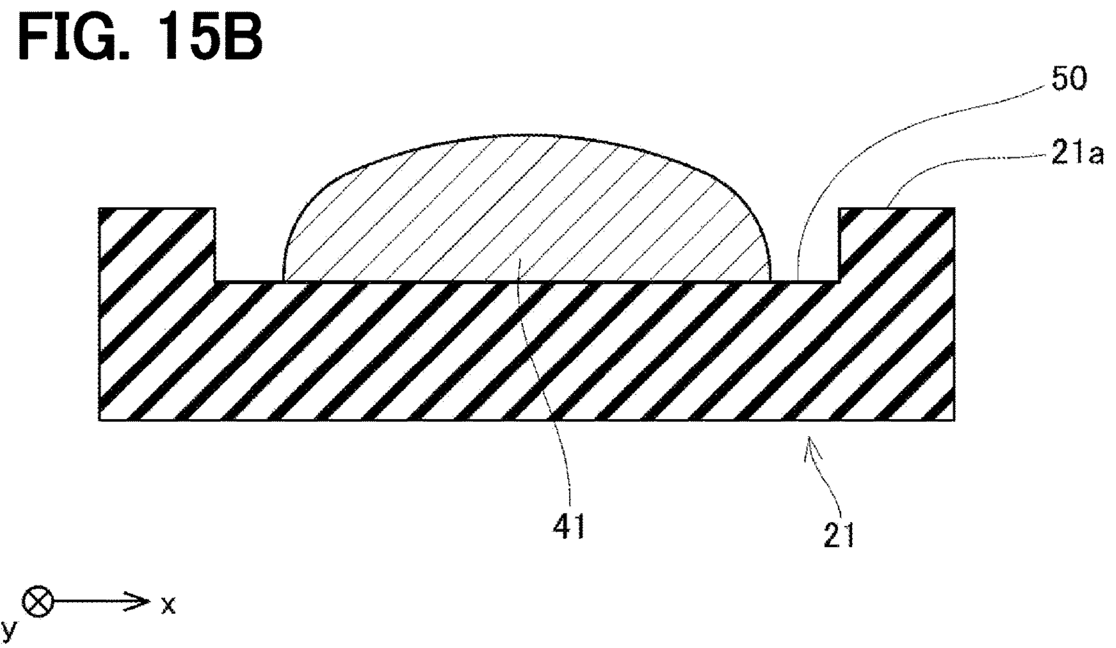
FIG. 15B is a cross-sectional view of FIG. 15A.
Figure 16A:
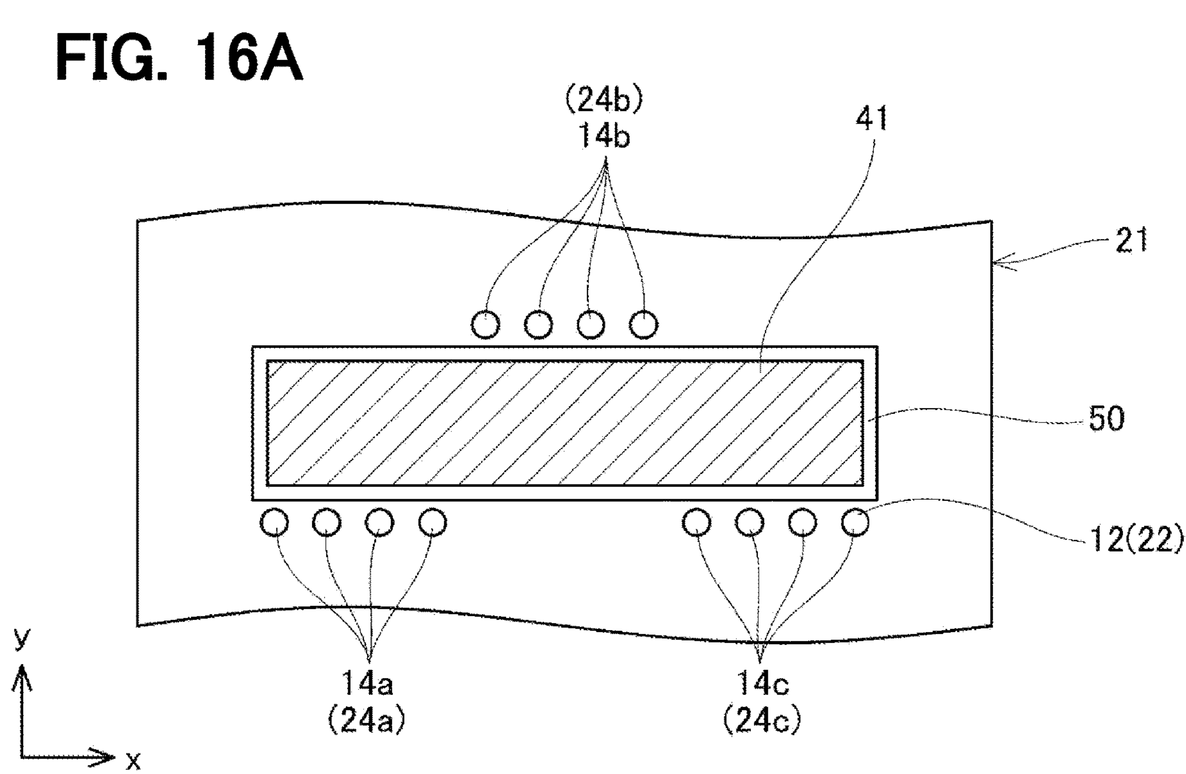
FIG. 16A is a plan view showing a manufacturing step of the circuit module of the eighth embodiment.
Figure 16B:
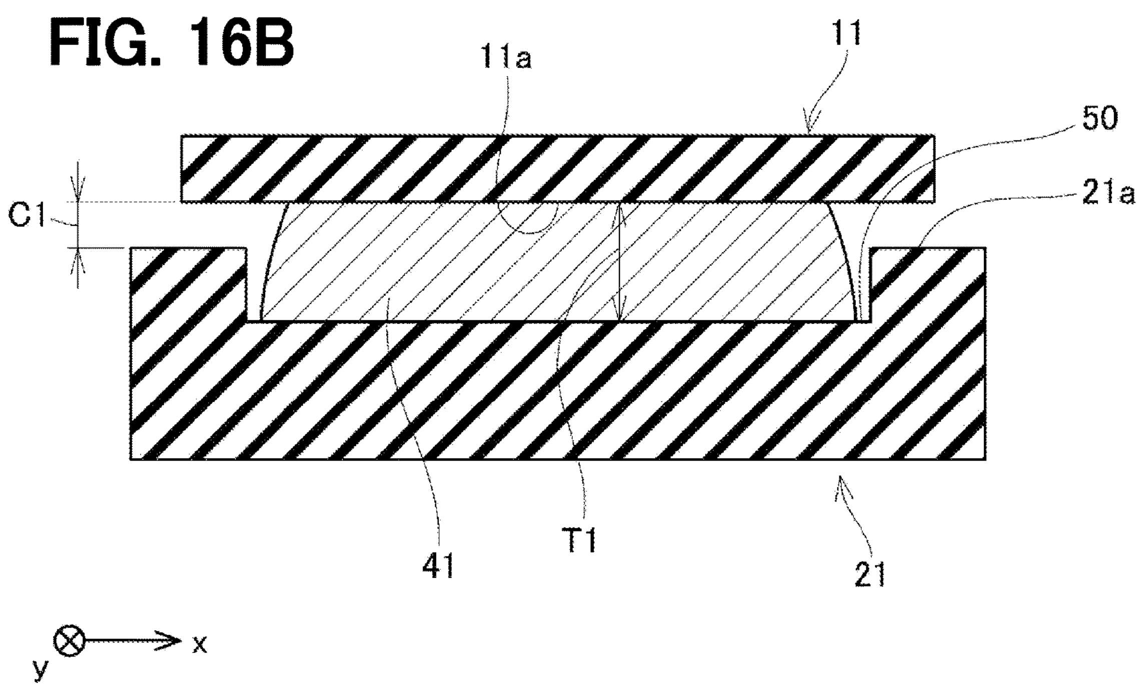
FIG. 16B is a cross-sectional view of FIG. 16A.
Figure 17A:
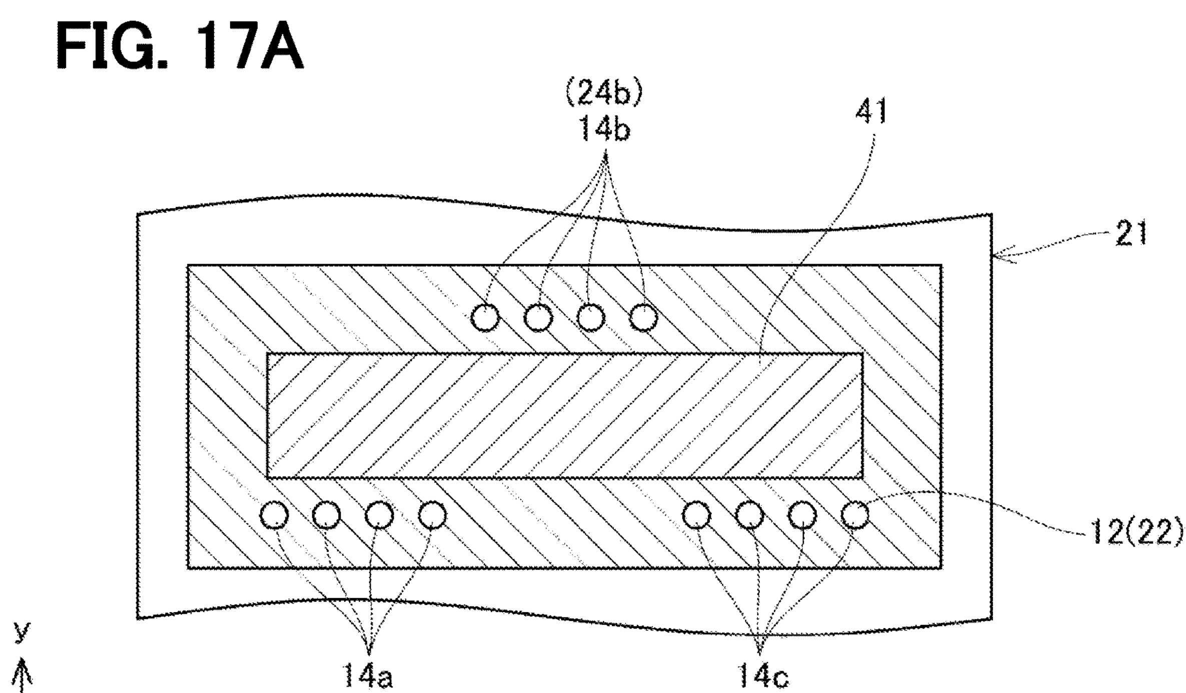
FIG. 17A is a plan view showing a manufacturing step of the circuit module of the eighth embodiment.
Figure 17B:
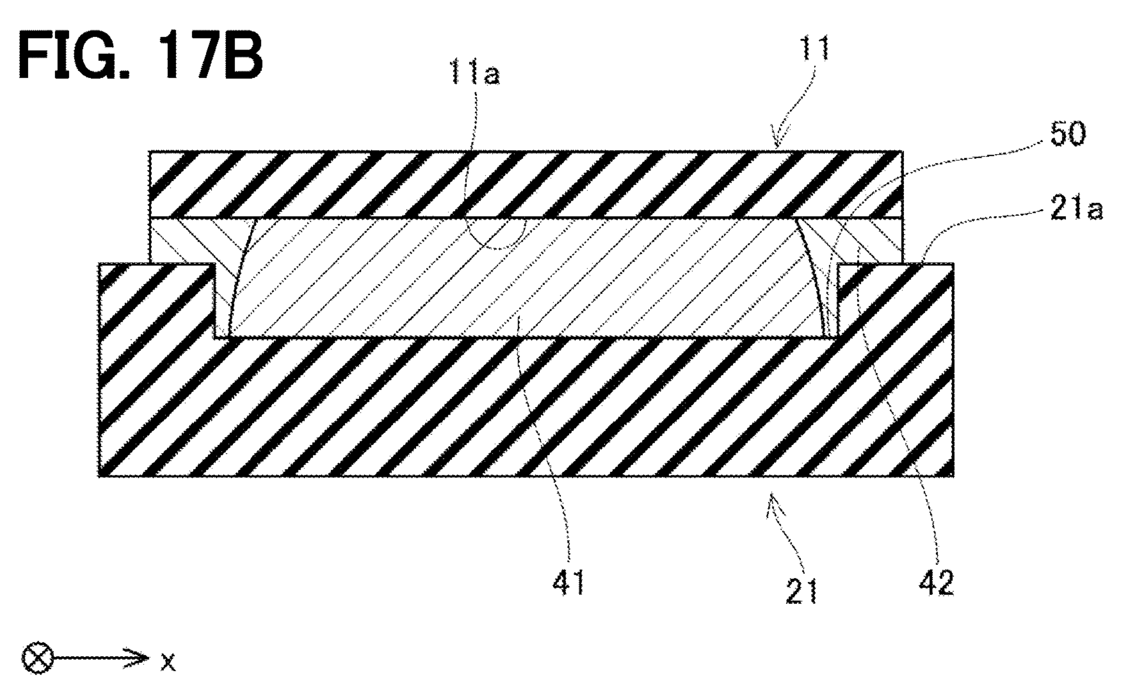
FIG. 17B is a cross-sectional view of FIG. 17A.

Further, as shown in FIG. 15A and FIG. 15B, a recess 50 is provided in the range between the straight lines 16*a* and 16*b* on the surface 21*a*, and the reinforcing bonding material 41 may be applied in the recess 50 in the applying process. Note that the electrode pads 22 are arranged outside the recess 50. In this configuration, the reinforcing bonding material 41 spreads laterally within the recess 50 as shown in FIGS. 16A and 16B in the subsequent lamination process. In this configuration, the thickness T1 of the reinforcing bonding material 41 can be made larger than the clearance C1 between the surface 11*a* of the circuit component 11 and the surface 21*a* of the circuit component 21. Therefore, even if the clearance C1 varies, the ratio of the variation with respect to the thickness T1 is small, and variation in the range in which the reinforcing bonding material 41 spreads in the lamination process can be suppressed. Thereby, it is possible to more reliably prevent the reinforcing bonding material 41 from coming into contact with the conductive bonding material 30. Moreover, since the electrode pads 12 and 22 are arranged outside the recess 50, the thickness of the conductive bonding material 30 can be reduced, and the electrical resistance of the conductive bonding material 30 can be reduced. Thereafter, as shown in FIGS. 17A and 17B, the reinforcing bonding material 42 can be formed around the reinforcing bonding material 41. The recess 50 may be provided on the surface 11*a* of the circuit component 11 or may be provided on both the surface 11*a* of the circuit component 11 and the surface 21*a* of the circuit component 21. These configurations also provide the same effects as the configurations of FIGS. 15A to 17B.

Figure 18A:
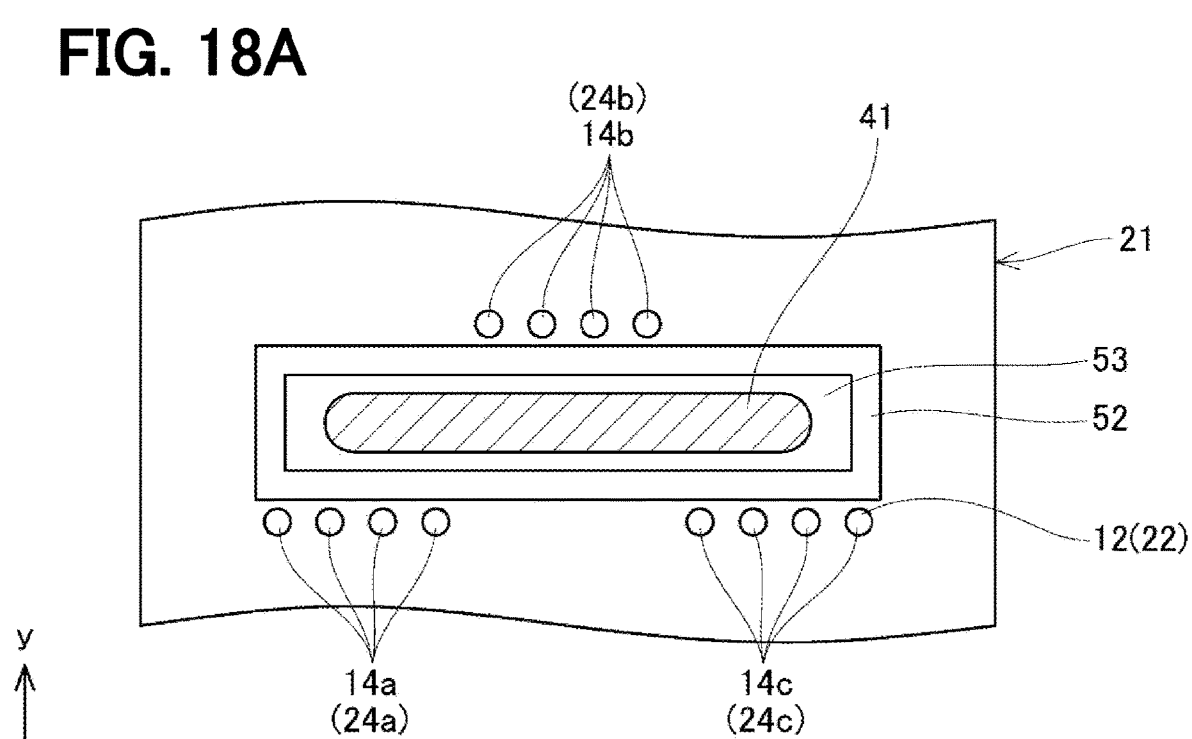
FIG. 18A is a plan view showing a manufacturing step of a circuit module according to a ninth embodiment.
Figure 18B:
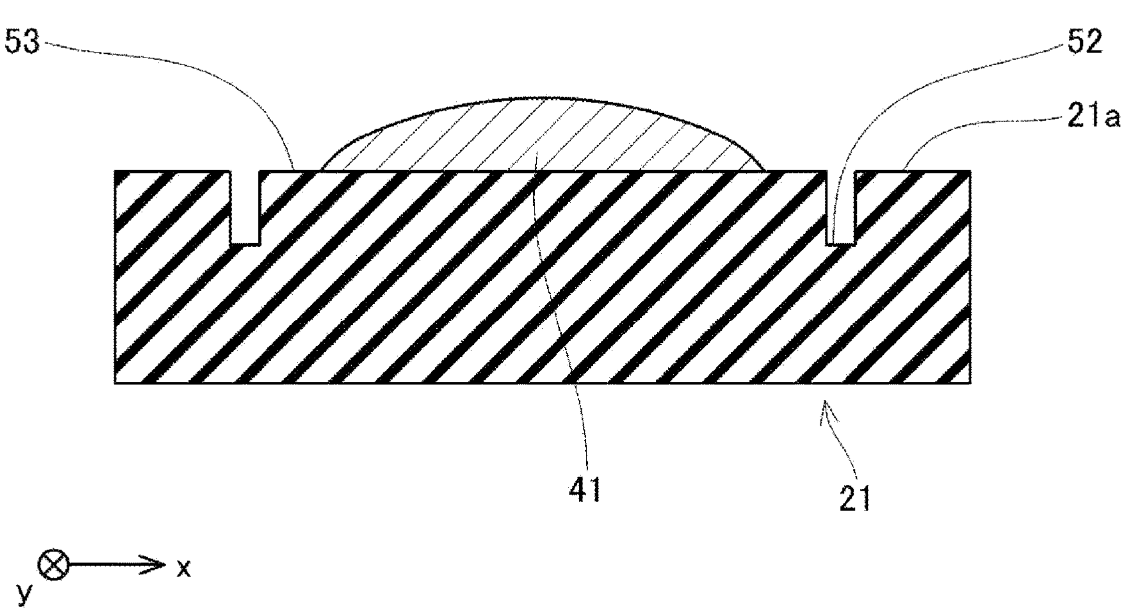
FIG. 18B is a cross-sectional view of FIG. 18A.
Figure 19A:
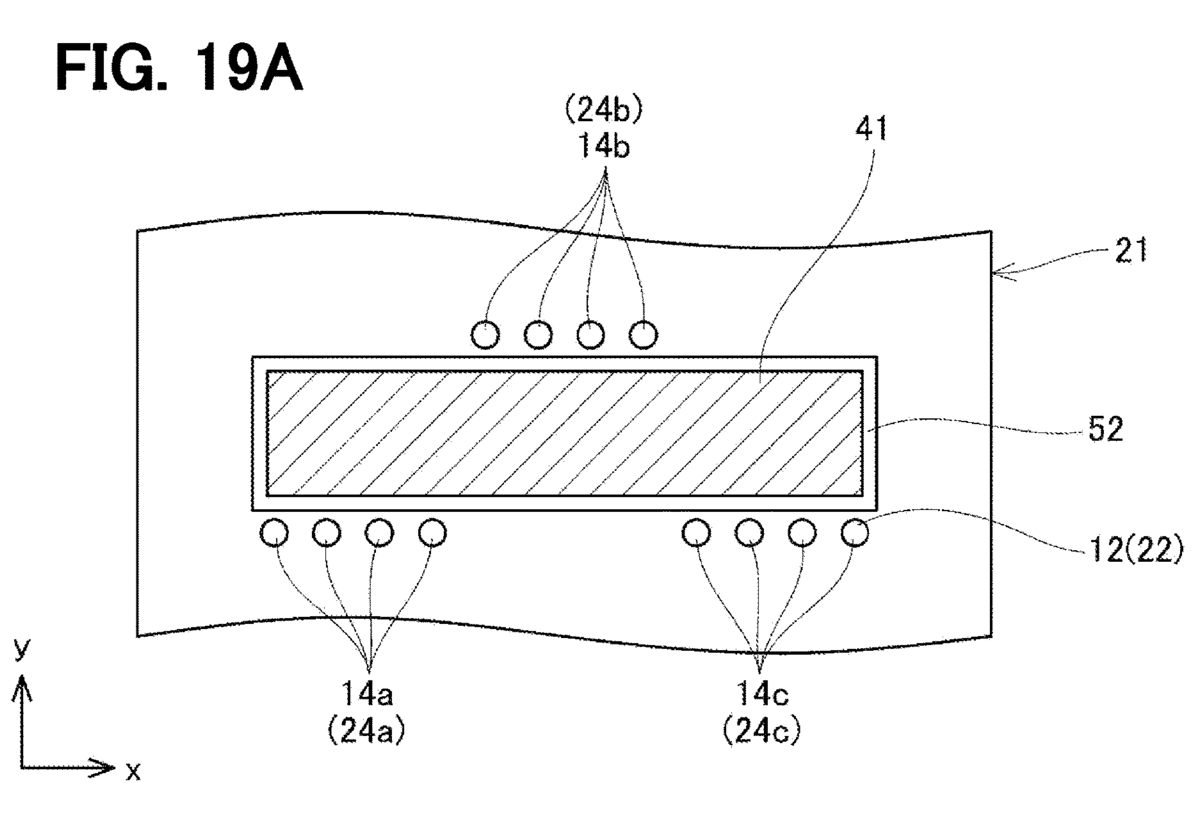
FIG. 19A is a plan view showing a manufacturing step of the circuit module of the ninth embodiment.
Figure 19B:
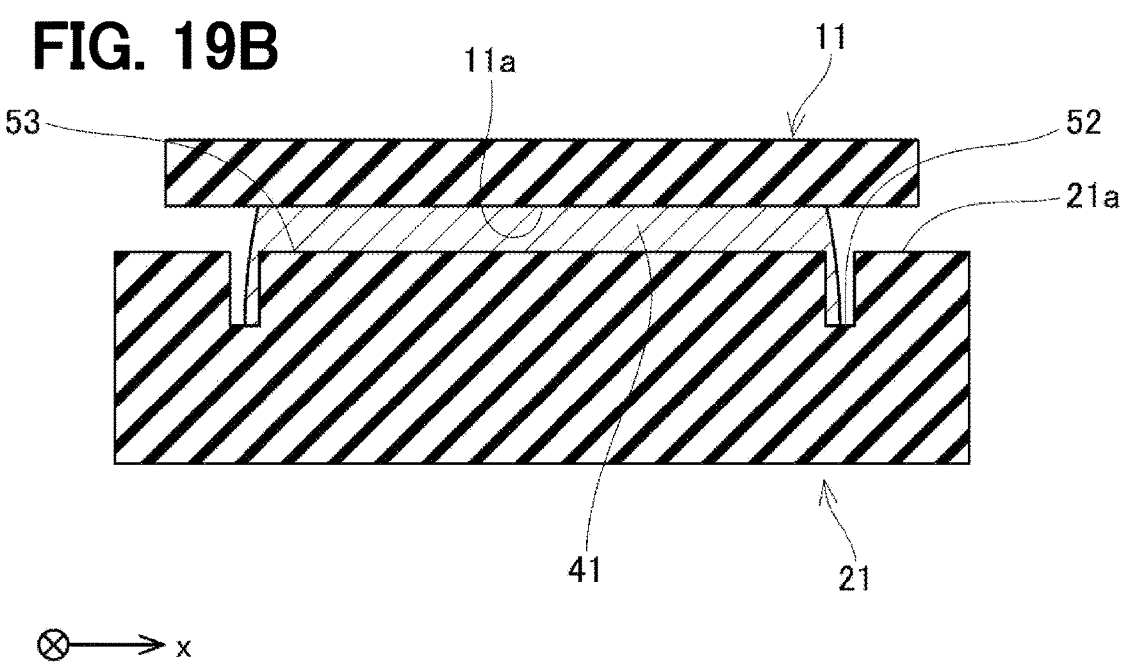
FIG. 19B is a cross-sectional view of FIG. 19A.
Figure 20A:
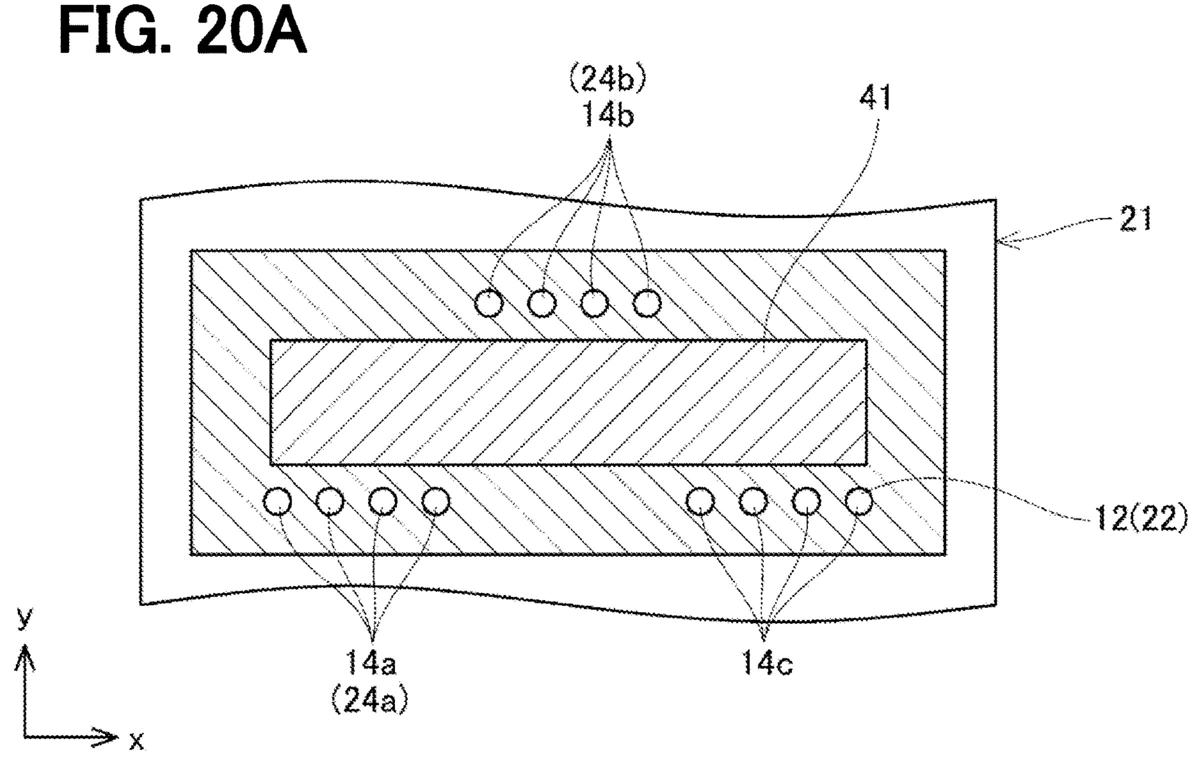
FIG. 20A is a plan view showing a manufacturing step of the circuit module of the ninth embodiment.
Figure 20B:
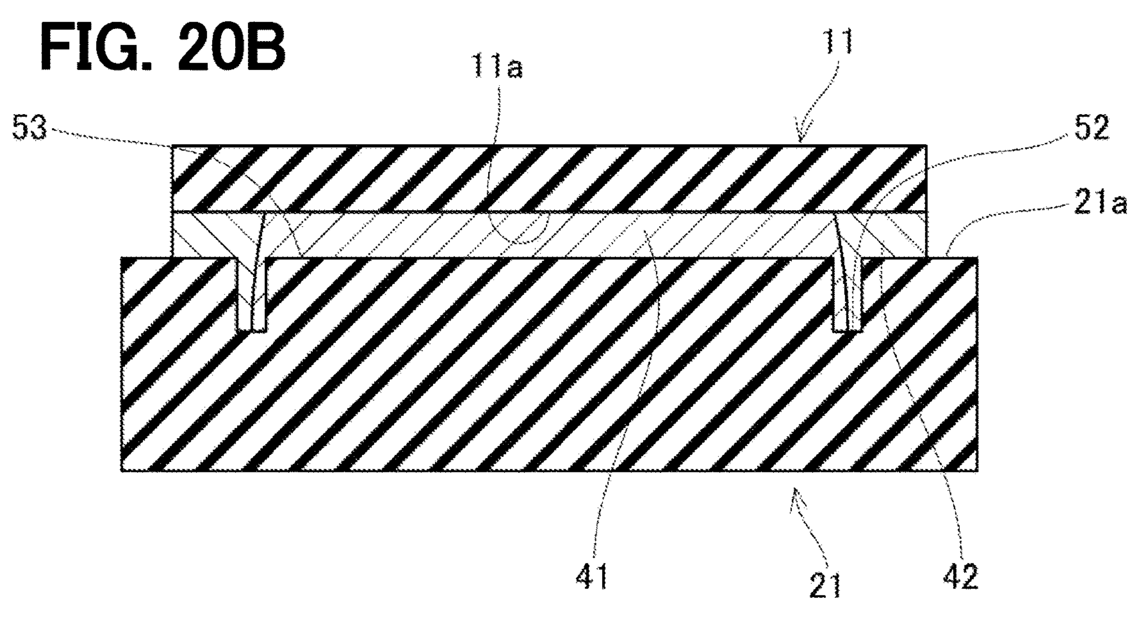
FIG. 20B is a cross-sectional view of FIG. 20A.
Figure 20B:
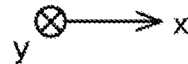

Further, as shown in FIGS. 18A and 18B, a groove 52 extending annularly is provided in the range between the straight lines 16*a* and 16*b* on the surface 21*a*. In the applying process, the reinforcing bonding material 41 is applied within an area 53 surrounded by the groove 52. Note that the electrode pads 22 are arranged outside the range surrounded by the groove 52. In this configuration, when the reinforcing bonding material 41 spreads in the lateral direction in the subsequent lamination process, as shown in FIGS. 19A and 19B, the surplus reinforcing bonding material 41 flows into the groove 52. As a result, the reinforcing bonding material 41 can be prevented from spreading outside the groove 52. Therefore, it is possible to suppress variation in the range in which the reinforcing bonding material 41 spreads in the lamination process. Therefore, it is possible to more reliably prevent the reinforcing bonding material 41 from coming into contact with the conductive bonding material 30. Thereafter, as shown in FIGS. 20A and 20B, the reinforcing bonding material 42 can be formed around the reinforcing bonding material 41. The groove 52 may be provided on the surface 11*a* of the circuit component 11 or may be provided on both the surface 11*a* of the circuit component 11 and the surface 21*a* of the circuit component 21. These configurations also provide the same effects as the configurations of FIGS. 18A to 20B.

Figure 21A:
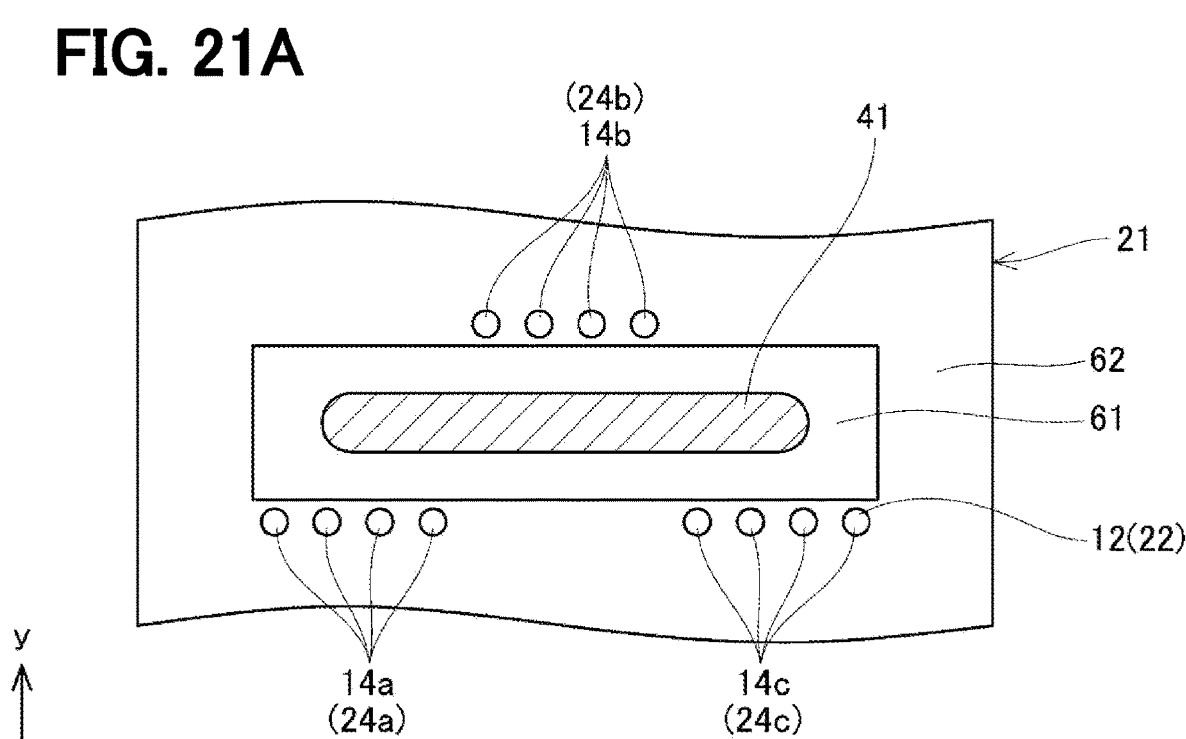
FIG. 21A is a plan view showing a manufacturing step of a circuit module according to a tenth embodiment.
Figure 21B:
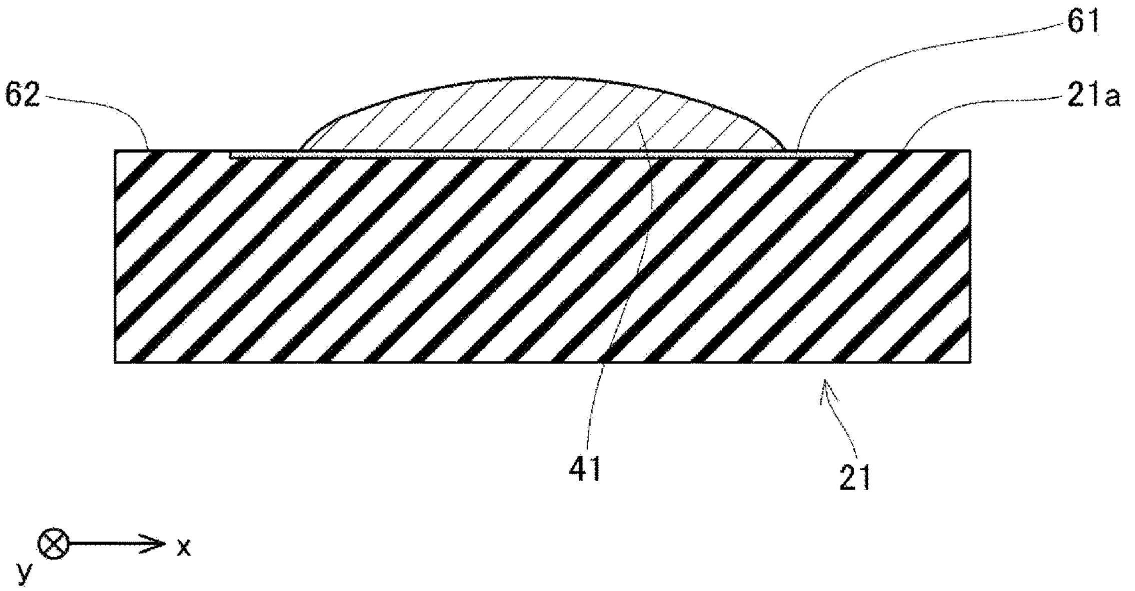
FIG. 21B is a cross-sectional view of FIG. 21A.
Figure 22A:
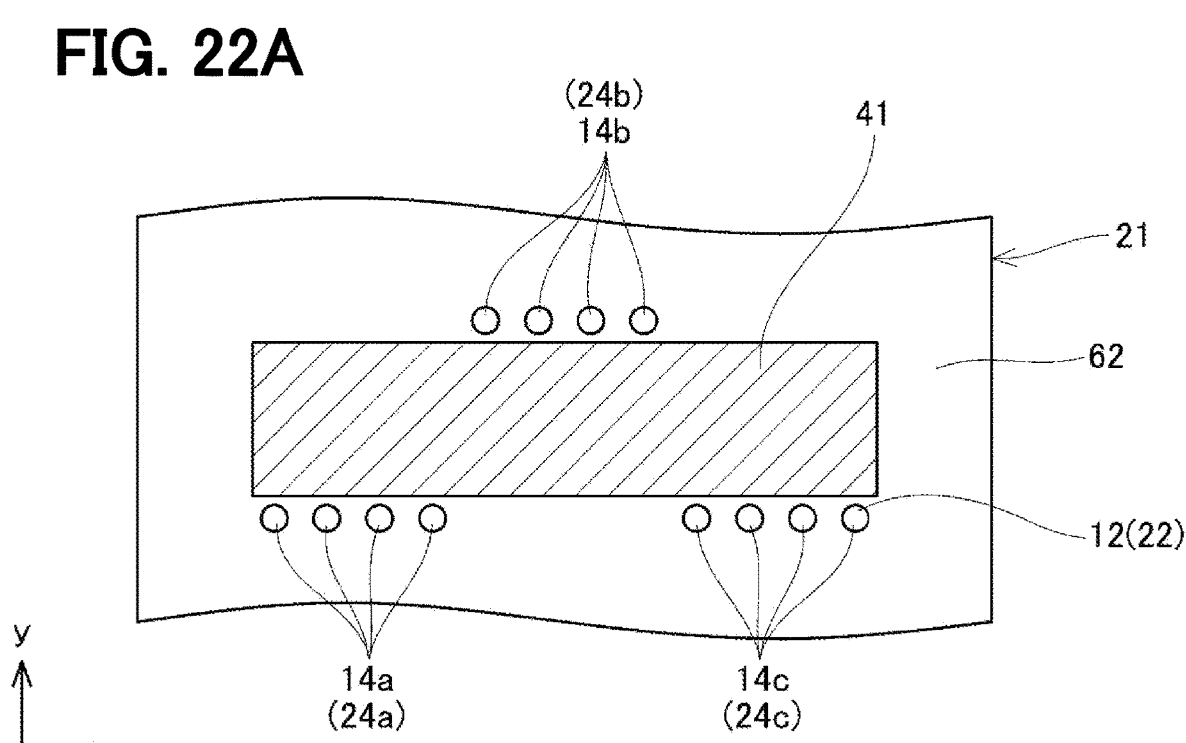
FIG. 22A is a plan view showing a manufacturing step of the circuit module of the tenth embodiment.
Figure 22B:
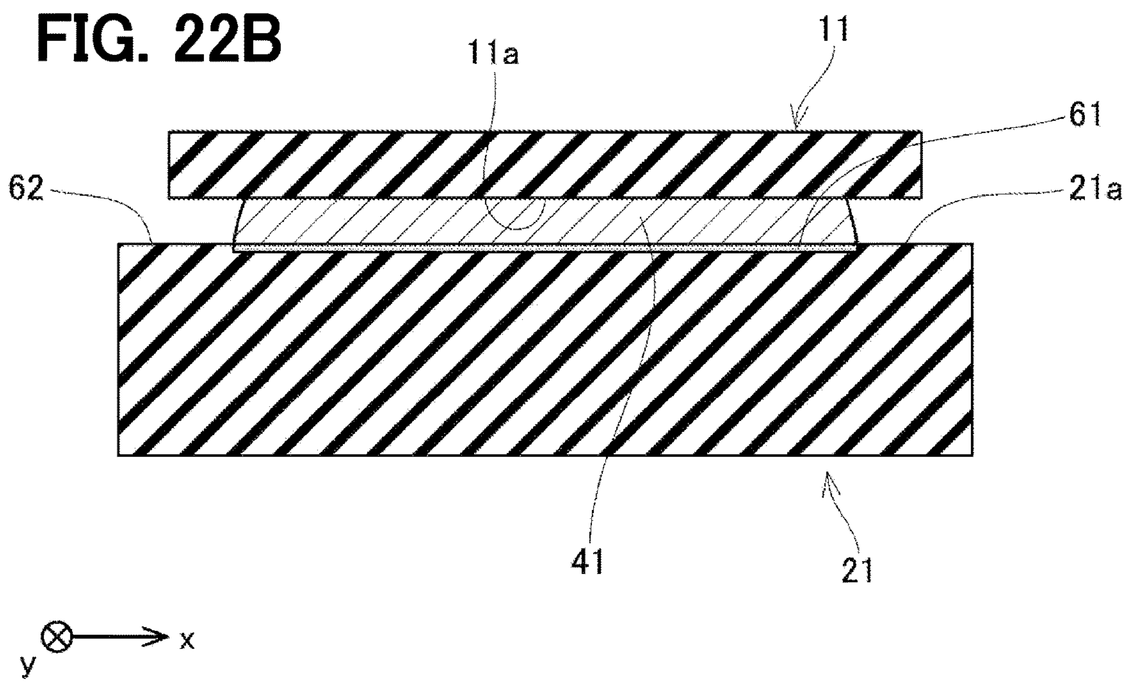
FIG. 22B is a cross-sectional view of FIG. 22A.
Figures 23A, 23B:
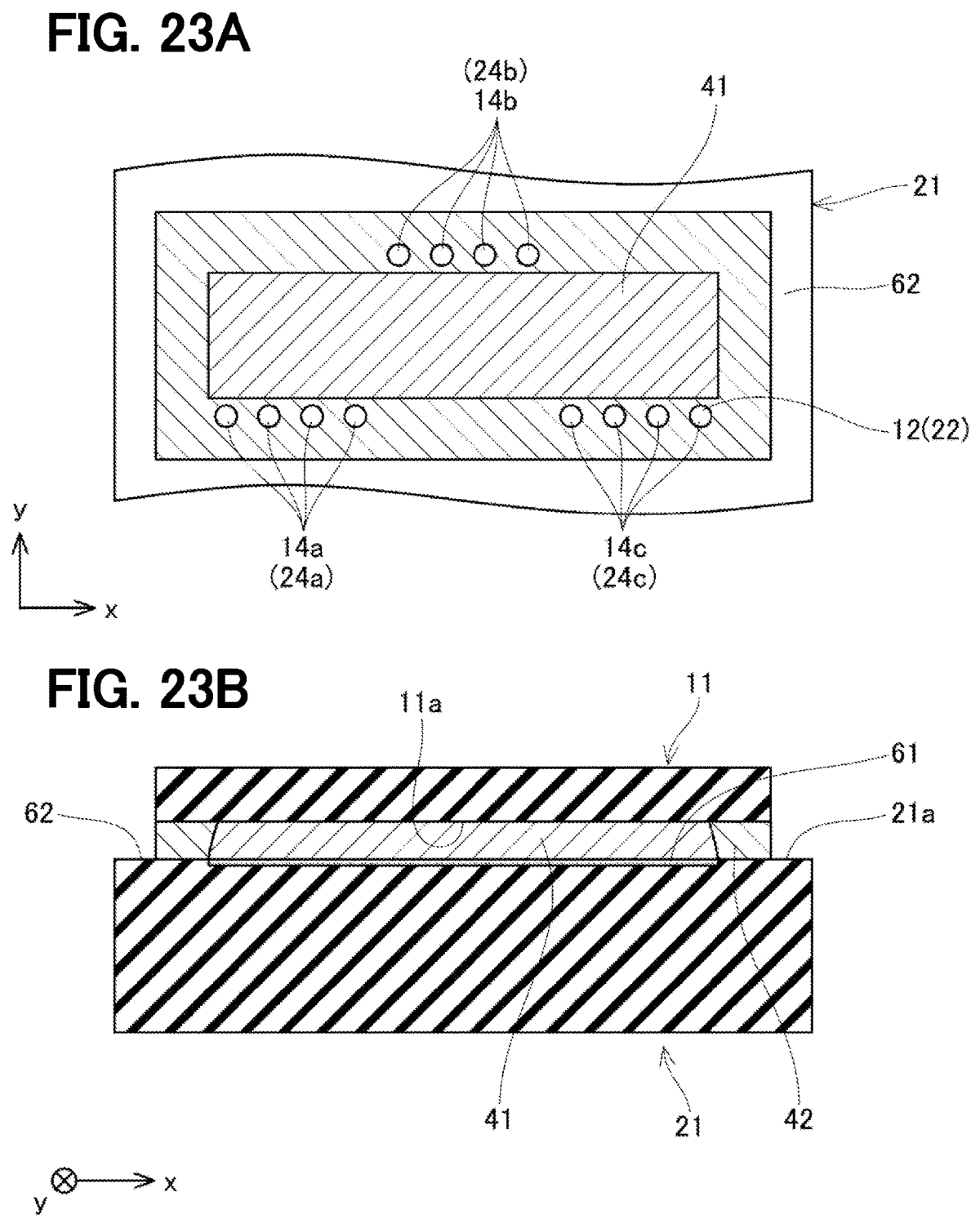

Further, as shown in FIGS. 21A and 21B, a less-rough surface 61 having a small surface roughness is provided in the range between the straight lines 16*a* and 16*b* on the surface 21*a*, and a rough surface 62 having a high surface roughness higher than that of the less-rough surface 61 is provided around the less-rough surface 61. Note that the electrode pads 22 are provided on the rough surface 62. In this case, the reinforcing bonding material 41 may be applied to the less-rough surface 61 in the applying process. In this configuration, when the reinforcing bonding material 41 spreads in the lateral direction in the subsequent lamination process, the reinforcing bonding material 41 easily flows on the less-rough surface 61 which is a relatively smooth surface, but the reinforcing bonding material 41 is difficult to flow on the rough surface 62. Therefore, as shown in FIGS. 22A and 22B, the reinforcing bonding material 41 is suppressed from spreading from the less-rough surface 61 to the rough surface 62. That is, it is easy to limit the range over which the reinforcing bonding material 41 spreads within the less-rough surface 61. Therefore, it is possible to suppress variation in the range in which the reinforcing bonding material 41 spreads in the lamination process. Therefore, it is possible to more reliably prevent the reinforcing bonding material 41 from coming into contact with the conductive bonding material 30. Thereafter, as shown in FIGS. 23A and 23B, the reinforcing bonding material 42 can be formed around the reinforcing bonding material 41. The less-rough surface 61 and the rough surface 62 may be provided on the surface 11*a* of the circuit component 11, or may be provided on both the surface 11*a* of the circuit component 11 and the surface 21*a* of the circuit component 21. These configurations also provide the same effects as the configurations of FIGS. 21A to 23B.

Further, the reinforcing bonding material 41 may be made of the same material as the conductive bonding material 30 instead of the insulating material. Accordingly, in the applying process, the conductive bonding material 30 and the reinforcing bonding material 41 can be applied to the surface 21*a* (or the surface 11*a*) at once. For example, the conductive bonding material 30 and the reinforcing bonding material 41 can be applied simultaneously by screen printing. With this configuration, the circuit module 10 can be manufactured more efficiently. Further, since the reinforcing bonding material 41 is not in contact with the conductive bonding material 30, a short circuit does not occur even if the reinforcing bonding material 41 has conductivity.

Figure 24:
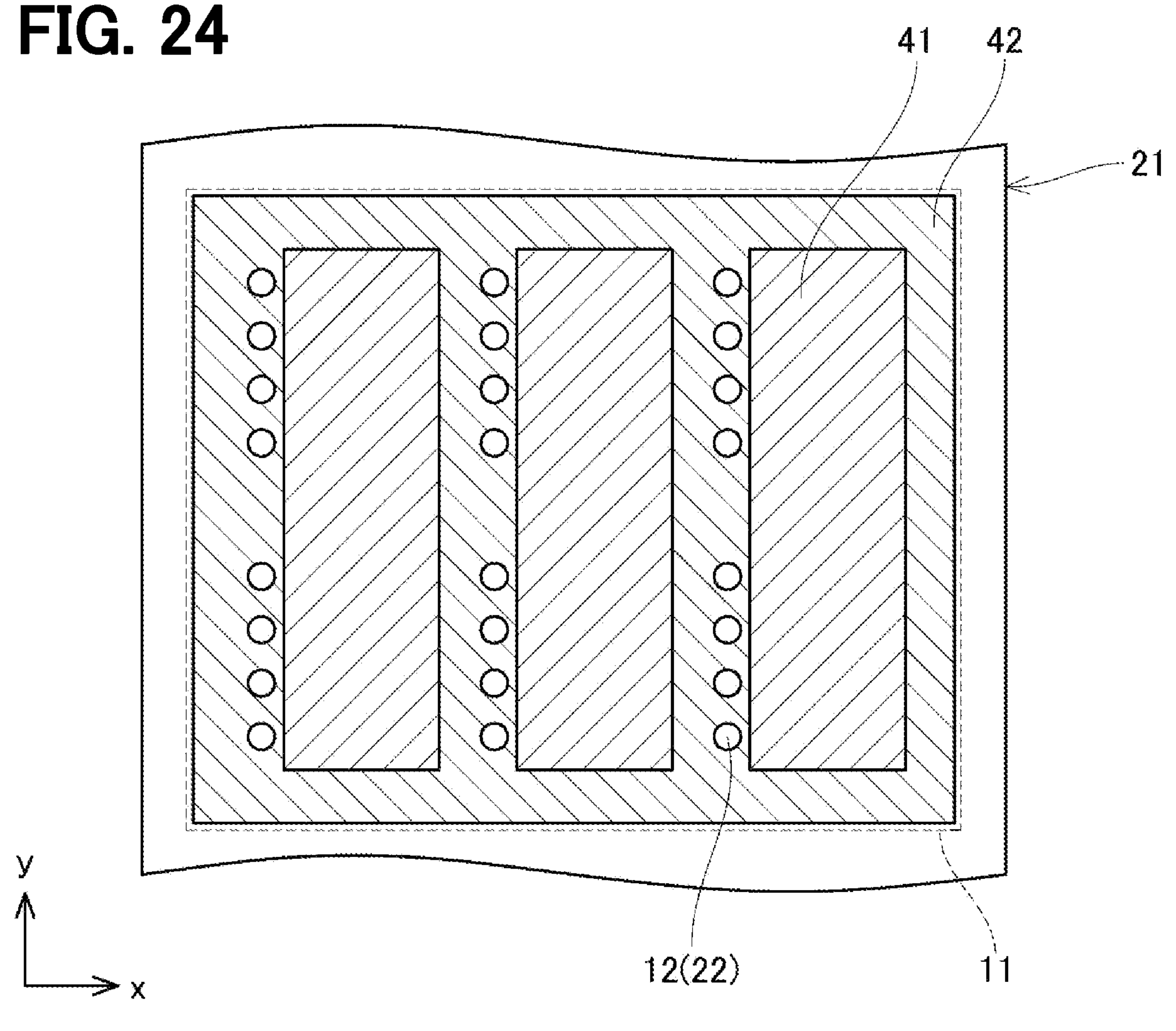
FIG. 24 is a plan view of a circuit module according to an eleventh embodiment.
Figure 25:
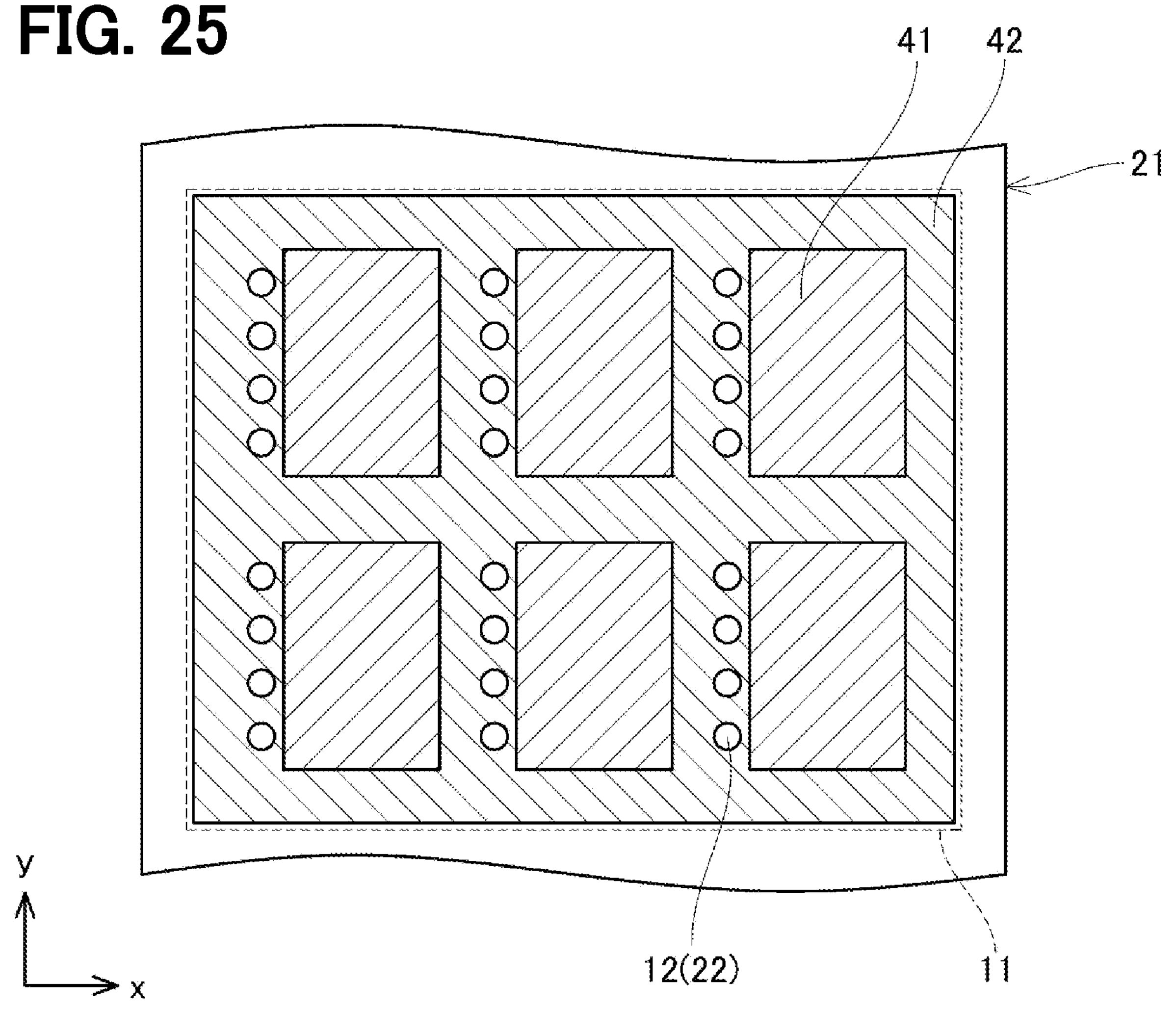
FIG. 25 is a plan view of a circuit module according to a twelfth embodiment.
Figure 26:
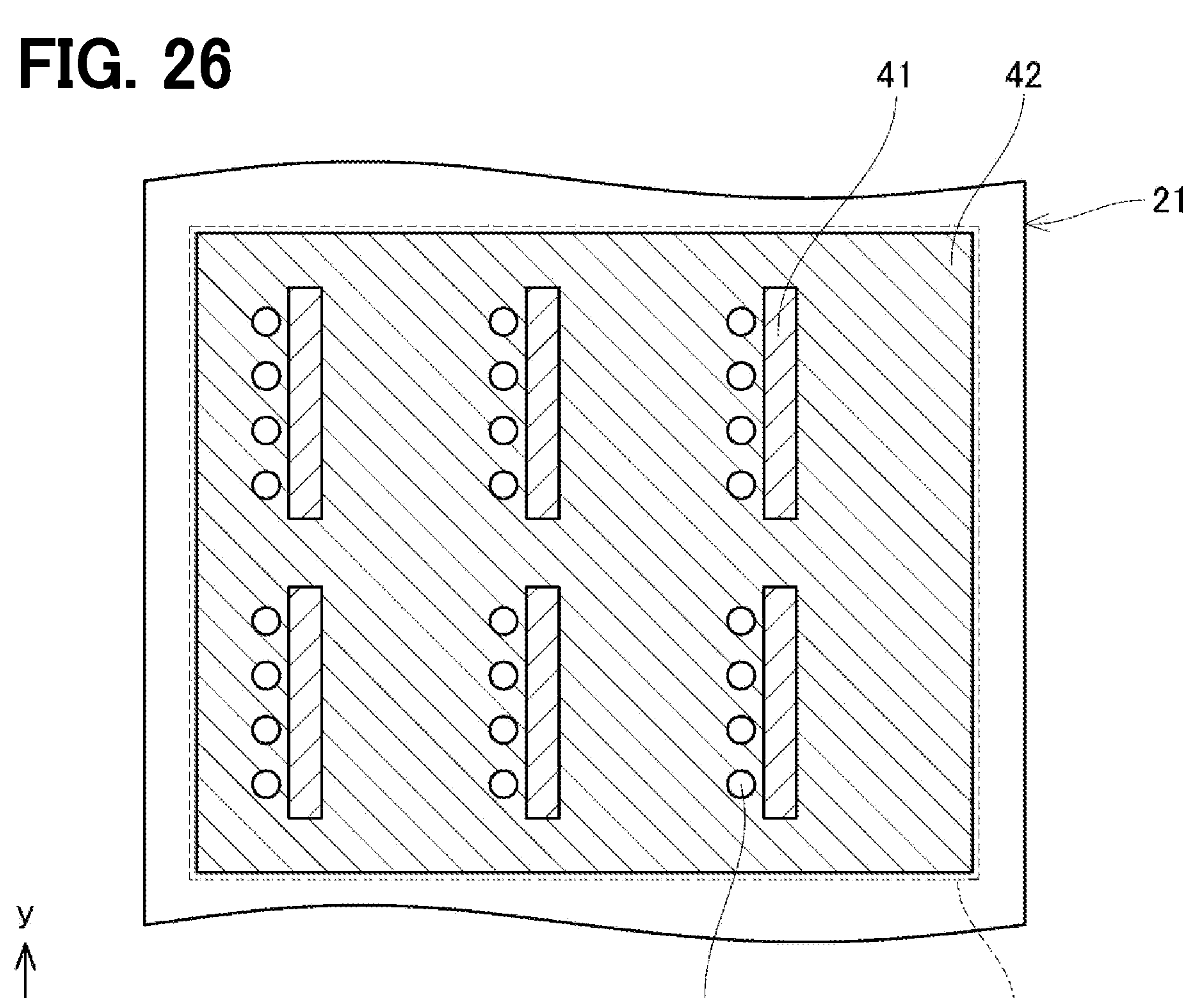
FIG. 26 is a plan view of a circuit module according to a thirteenth embodiment.

The distribution of the electrode pads 12 and 22 (that is, the distribution of the connecting portions of the conductive bonding material 30) can be freely changed. For example, distributions such as those shown in FIGS. 24 to 26 can be employed. Even in this case, the reinforcing bonding material 41 can be arranged with a gap from the conductive bonding material 30 and the reinforcing bonding material 42 can be provided so as to cover the conductive bonding material 30. Also in this case, it is possible to effectively suppress the thermal stress applied to the conductive bonding material 30 at the end of the row, when the reinforcing bonding material 41 continuously extends from one end of each row to the other end in the direction in which each row of the electrode pads 12 and 22 extends.

Figure 27:
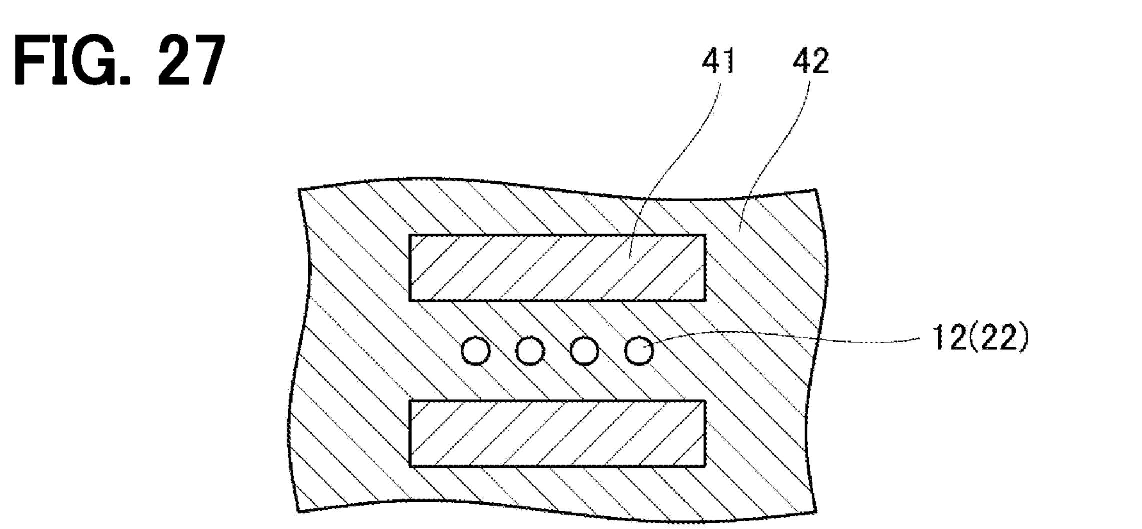
FIG. 27 is an enlarged plan view around electrode pads of a circuit module according to a fourteenth embodiment.
Figure 28:
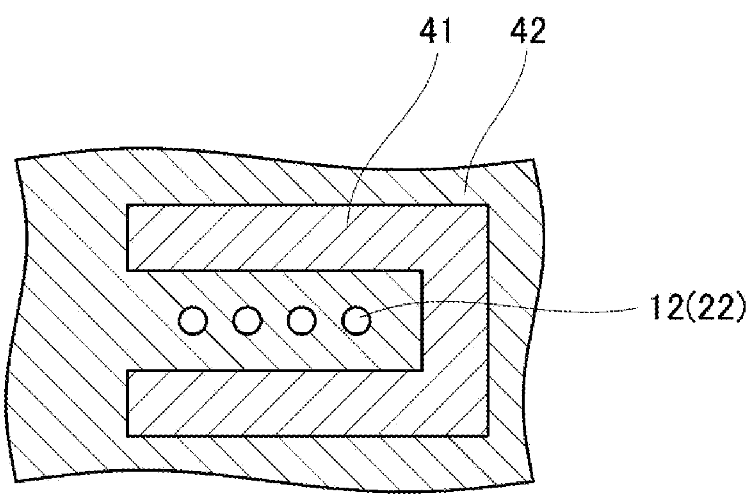
FIG. 28 is an enlarged plan view around electrode pads of a circuit module according to a fifteenth embodiment.
Figure 29:
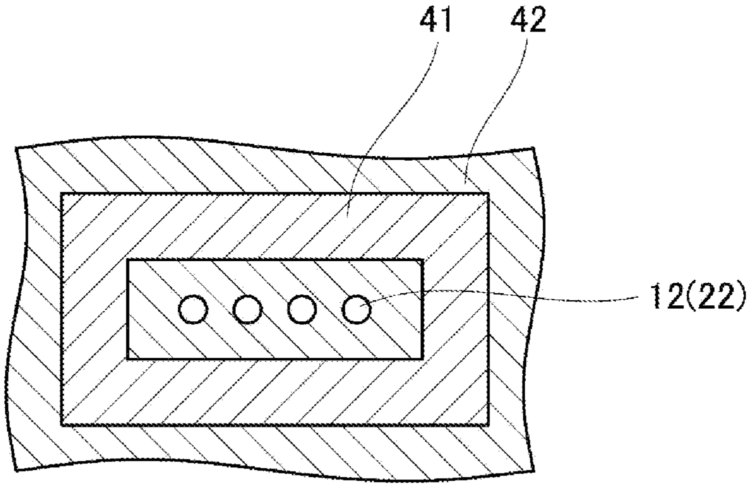
FIG. 29 is an enlarged plan view around electrode pads of a circuit module according to a sixteenth embodiment.
Figure 30:
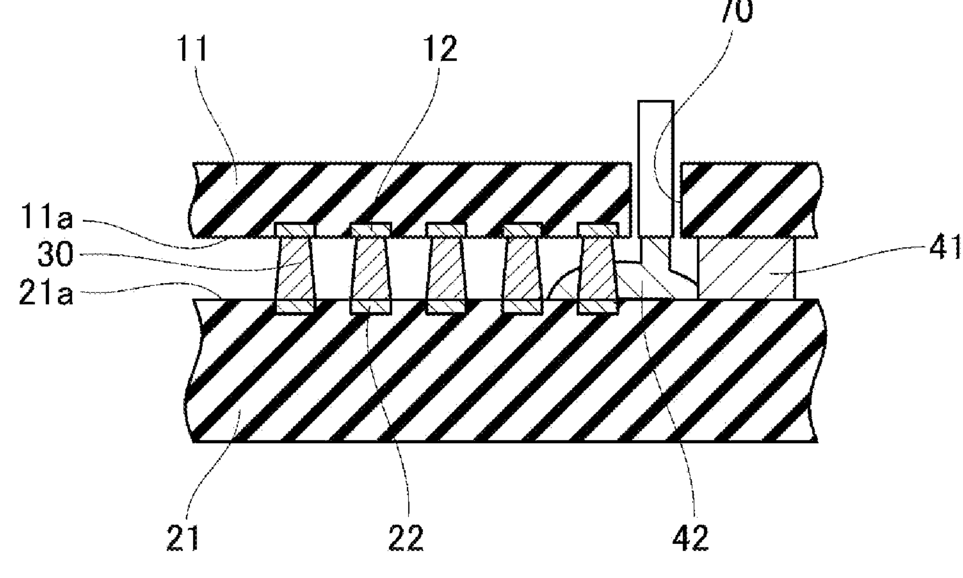
FIG. 30 is an explanatory diagram illustrating a method of manufacturing a circuit module of the fourteenth to sixteenth embodiments.

Further, as shown in FIGS. 27 to 29, the electrode pads 12, 22 may be provided in the range interposed or surrounded by the reinforcing bonding materials 41. In this case, in the process of applying the reinforcing bonding material 42, since the hardened reinforcing bonding material 41 exists, it is difficult to apply the reinforcing bonding material 42 around the electrode pad 12, 22 (that is, the conductive bonding material 30). Therefore, in this case, as shown in FIG. 30, the circuit component 11 is provided with a through hole 70 open to the surface 11*a*, and the reinforcing bonding material 42 is filled around the electrode pad 12, 22 through the through hole 70. Note that the through hole 70 may be provided in the circuit component 21.

Although the embodiment has been described in detail above, these are merely examples and do not limit the scope of claims. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A circuit module comprising:

a first circuit component having a first surface on which a plurality of electrode pads is arranged;

a second circuit component having a second surface on which a plurality of electrode pads is arranged;

a conductive bonding material made of a mixture of conductive material and resin;

a first reinforcing bonding material; and a second reinforcing bonding material made of a material different from the conductive bonding material and different from the first reinforcing bonding material, wherein the first circuit component and the second circuit component are arranged such that the plurality of electrode pads of the first circuit component respectively face the plurality of electrode pads of the second circuit component, the conductive bonding material joins the plurality of electrode pads of the first circuit component to the plurality of electrode pads of the second circuit component respectively, the first reinforcing bonding material is not in contact with the conductive bonding material and joins the first surface of the first circuit component to the second surface of the second circuit component, the second reinforcing bonding material covers a periphery of the conductive bonding material and is located in a range in contact with the first reinforcing bonding material, and the second reinforcing bonding material joins the first surface of the first circuit component to the second surface of the second circuit component, the plurality of electrode pads of the first circuit component are arranged to form a row linearly arranged along a longitudinal direction of the first reinforcing bonding material, an end of the first reinforcing bonding material in the longitudinal direction is located adjacent to an end of the row in the longitudinal direction of the first reinforcing bonding material, the plurality of electrode pads arranged to form the row include a first electrode pad at the end of the row and a second electrode pad which is closest to the first electrode pad, and adjacent is defined as the first electrode pad is closer to a closest part of the end in the longitudinal direction of the first reinforcing bonding material than the first electrode pad is to the second electrode pad.

2. The circuit module according to claim 1, wherein the plurality of electrode pads of the first circuit component are arranged to form a row linearly arranged along a first direction on the first surface of the first circuit component, the plurality of electrode pads of the second circuit component are linearly arranged along the first direction at a position facing the row, the first reinforcing bonding material is located at a position offset from the row in a second direction that intersects the first direction, and the first reinforcing bonding material is continuously distributed in the first direction from a position of one end of the row to a position of the other end of the row.

3. The circuit module according to claim 1, wherein the plurality of electrode pads of the first circuit component are arranged to form a first row linearly arranged along a first direction and a second row linearly arranged along the first direction at a position offset in a second direction intersecting the first direction, on the first surface of the first circuit component, the plurality of electrode pads of the second circuit component are arranged to form a third row linearly arranged along the first direction at a position facing the first row and a fourth row linearly arranged along the first direction at a position facing the second row, and the first reinforcing bonding material is arranged between the first row and the second row in the second direction.

4. The circuit module according to claim 1, wherein one of the first circuit component and the second circuit component has a gate switching element, and the other of the first circuit component and the second circuit component has a gate control circuit that controls a gate voltage of the gate switching element.

5. The circuit module according to claim 1, wherein a coefficient of linear expansion of the second reinforcing bonding material is higher than a coefficient of linear expansion of the conductive bonding material.

6. The circuit module according to claim 1, wherein a coefficient of linear expansion of the first reinforcing bonding material is lower than a coefficient of linear expansion of the conductive bonding material.

7. The circuit module according to claim 1, wherein a coefficient of linear expansion of the first reinforcing bonding material is higher than half of a coefficient of linear expansion of the second reinforcing bonding material.

8. The circuit module according to claim 1, wherein the first reinforcing bonding material is arranged to form a plurality of islands separated from each other, and the second reinforcing bonding material surrounds each island of the plurality of islands.

9. The circuit module according to claim 1, wherein at least one of the first surface of the first circuit component and the second surface of the second circuit component has a recess, and the first reinforcing bonding material is disposed within the recess.

10. The circuit module according to claim 1, wherein at least one of the first surface of the first circuit component and the second surface of the second circuit component has a groove that annularly extends, the first reinforcing bonding material is disposed within an area surrounded by the groove, and an outer peripheral edge of the first reinforcing bonding material is disposed within the groove.

11. The circuit module according to claim 1, wherein at least one of the first surface of the first circuit component and the second surface of the second circuit component has a less-rough face and a rough face having a surface roughness rougher than the less-rough face, and the first reinforcing bonding material is in contact with the less-rough face.

12. The circuit module according to claim 1, wherein the first reinforcing bonding material is made of a same material as the conductive bonding material.

13. The circuit module according to claim 1, wherein a ratio of an area of a bonding range by the conductive bonding material to an area of a facing portion where the first circuit component and the second circuit component face each other is less than or equal to 15%.

14. The circuit module according to claim 1, wherein the first reinforcing bonding material is continuously extended to outside of the end of the row in the longitudinal direction of the first reinforcing bonding material.

15. The circuit module according to claim 14, wherein a first distance is defined between the end of the first reinforcing bonding material and the end of the row in the longitudinal direction, a second distance is defined between the first reinforcing bonding material and the row in a lateral direction perpendicular to the longitudinal direction, and the first distance is greater than the second distance.

16. A method of manufacturing the circuit module according to claim 1, comprising:

disposing the conductive bonding material and the first reinforcing bonding material between the first circuit component and the second circuit component;

heating a laminate of the first circuit component and the second circuit component such that the conductive bonding material is fixed to the plurality of electrode pads of the first circuit component and the plurality of electrode pads of the second circuit component and that the first reinforcing bonding material is fixed to the first surface of the first circuit component and the second surface of the second circuit component;

applying a second reinforcing bonding material made of a material different from the conductive bonding material and the first reinforcing bonding material between the first surface of the first circuit component and the second surface of the second circuit component such that the second reinforcing bonding material covers a periphery of the conductive bonding material and is distributed in a range in contact with the first reinforcing bonding material and that the second reinforcing bonding material is in contact with the first surface of the first circuit component and the second surface of the second circuit component; and heating the laminate such that second reinforcing bonding material is fixed to the first surface of the first circuit component and the second surface of the second circuit component.

17. The method according to claim 16, wherein the first reinforcing bonding material is made of a same material as the conductive bonding material, the disposing of the conductive bonding material and the first reinforcing bonding material between the first circuit component and the second circuit component comprises:

applying the conductive bonding material and the first reinforcing bonding material, at a same time, to one of the first surface of the first circuit component and the second surface of the second circuit component.

18. The method according to claim 16, wherein the first circuit component has a through hole open to the first surface of the first circuit component, the applying of the second reinforcing bonding material comprises:

injecting the second reinforcing bonding material between the first surface of the first circuit component and the second surface of the second circuit component through the through hole.

19. The method according to claim 16, wherein the second circuit component has a through hole open to the second surface of the second circuit component, the applying of the second reinforcing bonding material comprises:

injecting the second reinforcing bonding material between the first surface of the first circuit component and the second surface of the second circuit component through the through hole.

* * * * *